(12) United States Patent
Nomura

(10) Patent No.: US 8,174,421 B2
(45) Date of Patent: May 8, 2012

(54) INFORMATION PROCESSING APPARATUS

(75) Inventor: Osamu Nomura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 184 days.

(21) Appl. No.: 12/673,967

(22) PCT Filed: Aug. 28, 2008

(86) PCT No.: PCT/JP2008/065916
§ 371 (c)(1),
(2), (4) Date: Feb. 17, 2010

(87) PCT Pub. No.: WO2009/028723
PCT Pub. Date: Mar. 5, 2009

(65) Prior Publication Data
US 2011/0163902 A1    Jul. 7, 2011

(30) Foreign Application Priority Data

Aug. 31, 2007   (JP) .................................. 2007-226705

(51) Int. Cl.
*H03M 1/12*    (2006.01)
(52) U.S. Cl. ........ 341/155; 341/118; 341/120; 341/122; 341/164; 341/165; 345/212; 345/690; 348/294; 348/302
(58) Field of Classification Search .......... 341/118–120, 341/155, 122, 158, 164, 165, 169, 170; 345/212, 345/690; 348/294, 302
See application file for complete search history.

(56) References Cited

U.S. PATENT DOCUMENTS

| 5,877,715 | A  | * | 3/1999 | Gowda et al. ................. 341/122 |
| 6,271,785 | B1 |   | 8/2001 | Martin et al. ................. 341/169 |
| 6,559,788 | B1 | * | 5/2003 | Murphy ........................ 341/164 |
| 7,120,617 | B2 |   | 10/2006 | Nomura et al. |
| 7,272,585 | B2 |   | 9/2007 | Nomura et al. |
| 7,339,672 | B2 |   | 3/2008 | Hashiguchi et al. .......... 356/394 |
| 7,538,702 | B2 | * | 5/2009 | Baker ........................... 341/142 |
| 7,610,326 | B2 |   | 10/2009 | Korekado et al. |
| 7,733,262 | B2 | * | 6/2010 | Baker ........................... 341/164 |
| 7,767,953 | B2 | * | 8/2010 | Yamaoka ................... 250/214 R |

(Continued)

FOREIGN PATENT DOCUMENTS

EP   0 954 167   11/1999

(Continued)

*Primary Examiner* — Linh Nguyen

(74) *Attorney, Agent, or Firm* — Fitzpatrick, Cella, Harper & Scinto

(57) ABSTRACT

An information processing apparatus, includes: a plurality of processor means respectively including storage means for storing analog information and comparison means for comparing analog information stored in the storage means with an inputted reference analog value; input means for inputting the reference analog value to the plurality of processor means while changing the reference analog value in synchronization with a clock signal; and counter means for updating a count value in synchronization with the clock signal and outputting the count value when the analog information and the reference analog value become consistent at a corresponding comparison means.

10 Claims, 18 Drawing Sheets

U.S. PATENT DOCUMENTS

| | | | |
|---|---|---|---|
| 7,868,280 B2 * | 1/2011 | Park et al. | 250/205 |
| 2003/0015647 A1 * | 1/2003 | Guo et al. | 250/208.1 |
| 2003/0151617 A1 * | 8/2003 | Morita | 345/690 |
| 2005/0138100 A1 | 6/2005 | Nomura et al. | |
| 2007/0194962 A1 * | 8/2007 | Asayama et al. | 341/144 |
| 2009/0166510 A1 * | 7/2009 | Park et al. | 250/205 |
| 2010/0141623 A1 * | 6/2010 | Nakanishi et al. | 345/207 |
| 2010/0265374 A1 * | 10/2010 | Nishi | 348/302 |

FOREIGN PATENT DOCUMENTS

| | | |
|---|---|---|
| JP | 2000-32350 | 1/2000 |
| JP | 2003-125292 | 4/2003 |
| JP | 2005-198149 | 7/2005 |
| JP | 2007-59991 | 3/2007 |

* cited by examiner

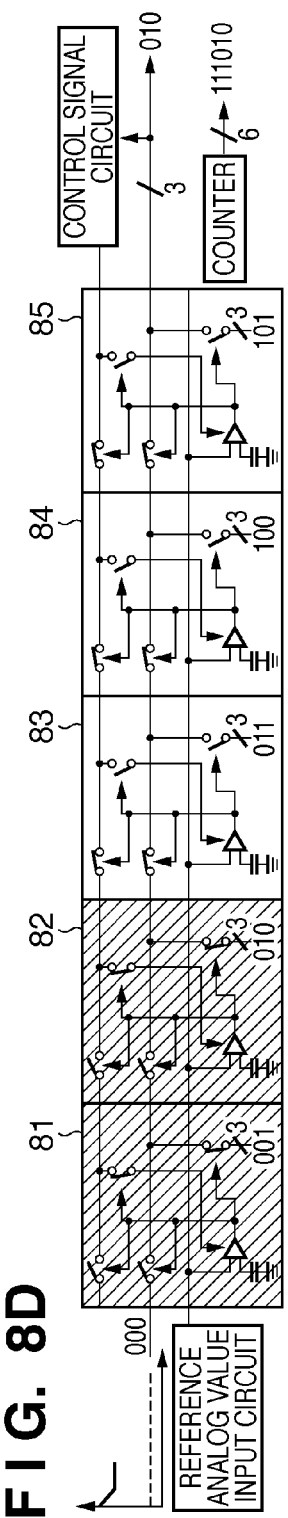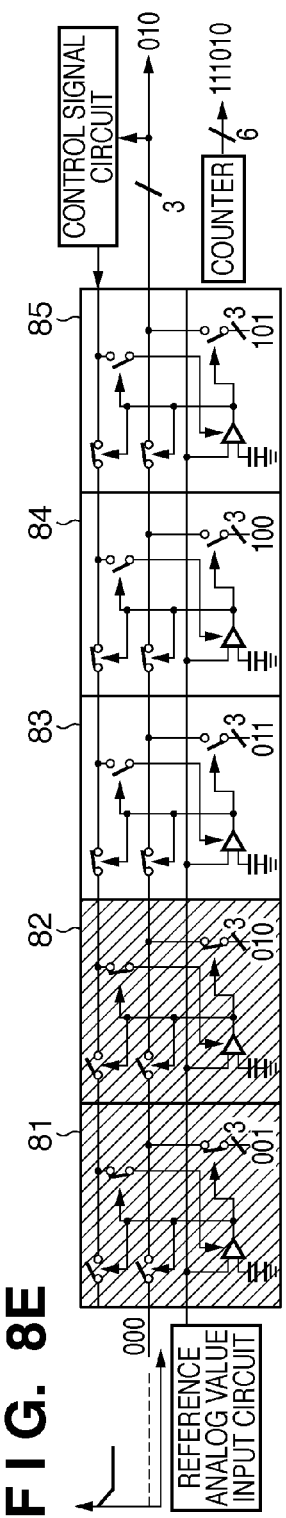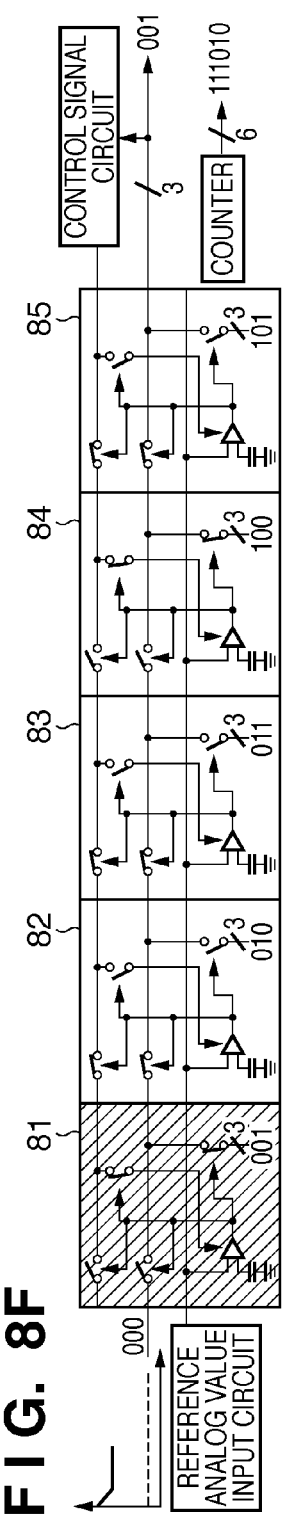

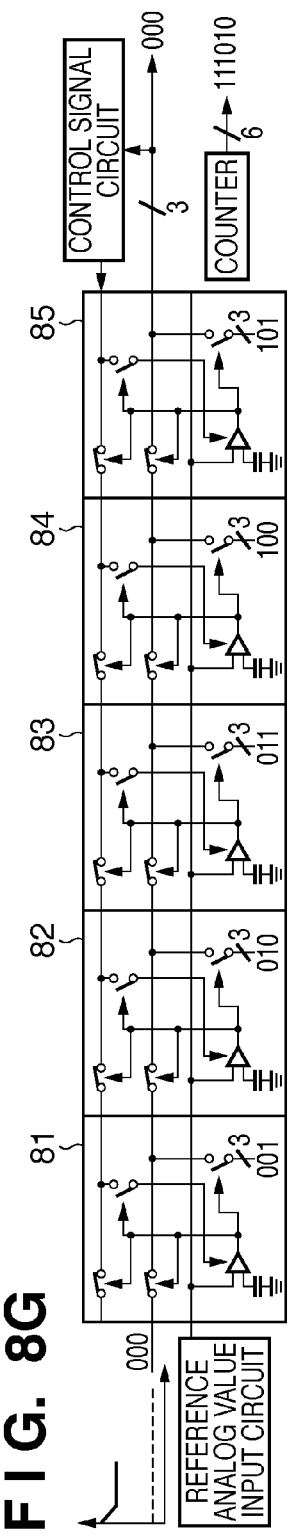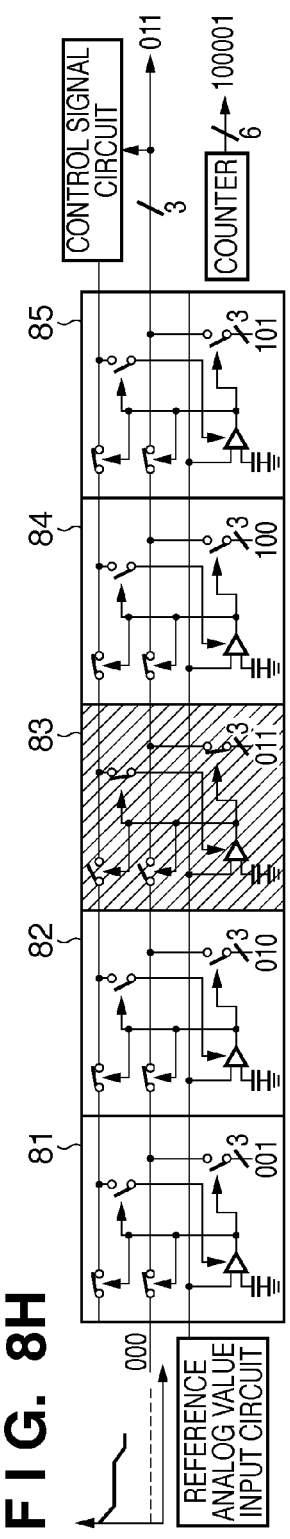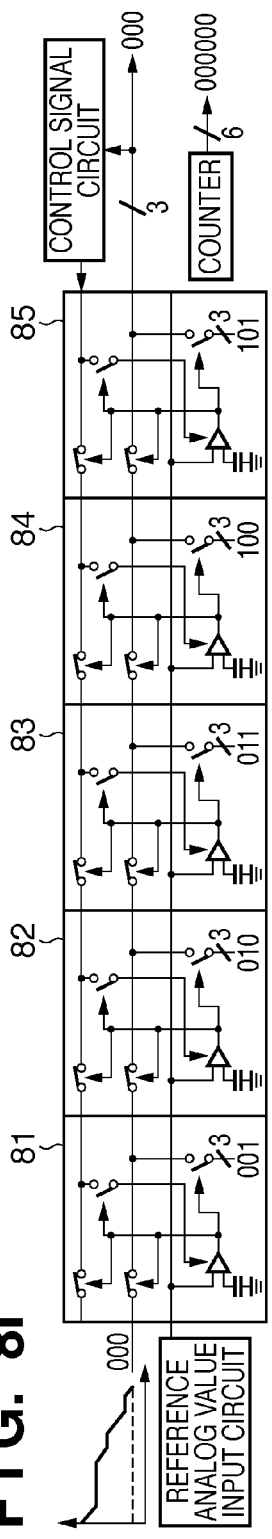

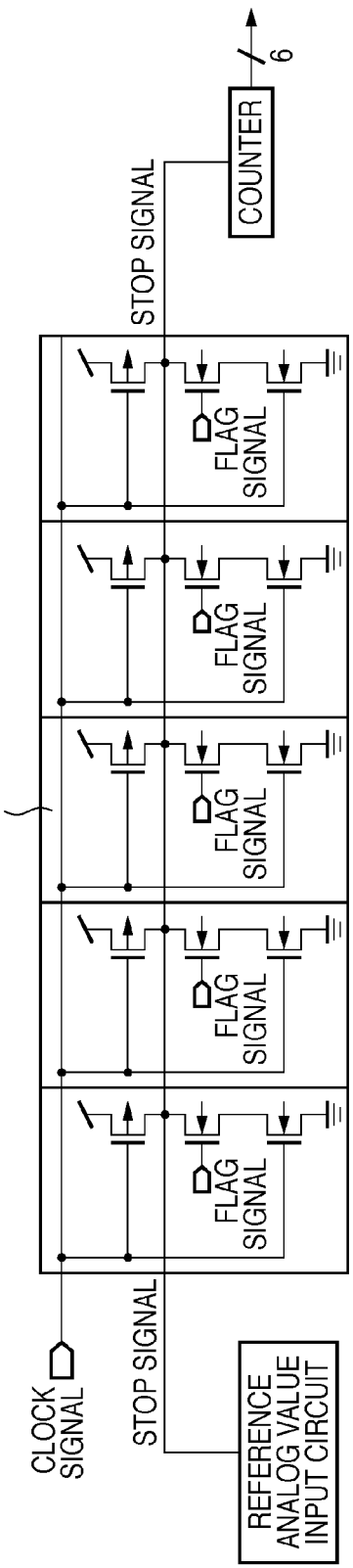

F I G. 18
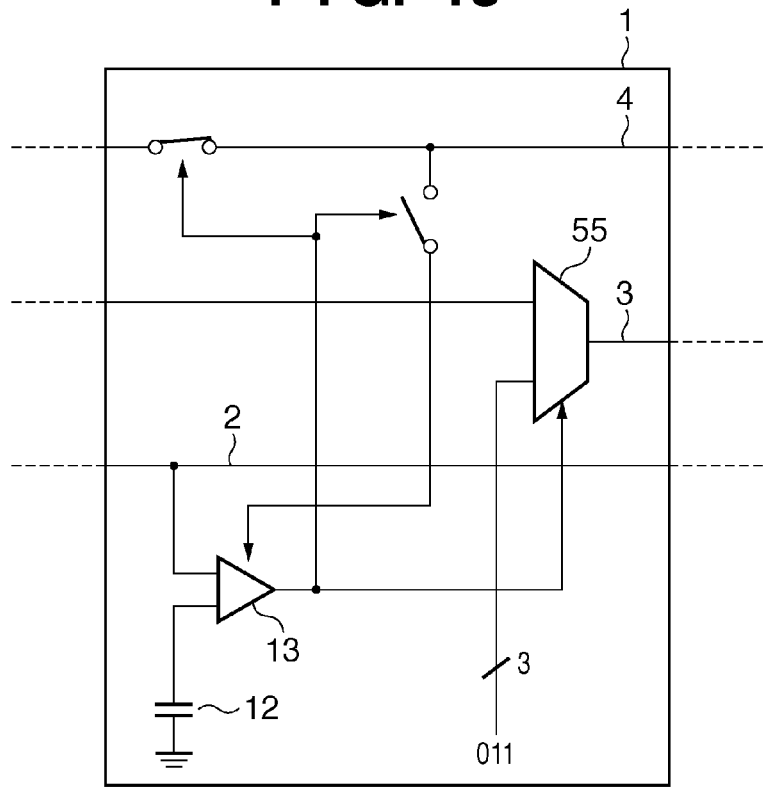
F I G. 19
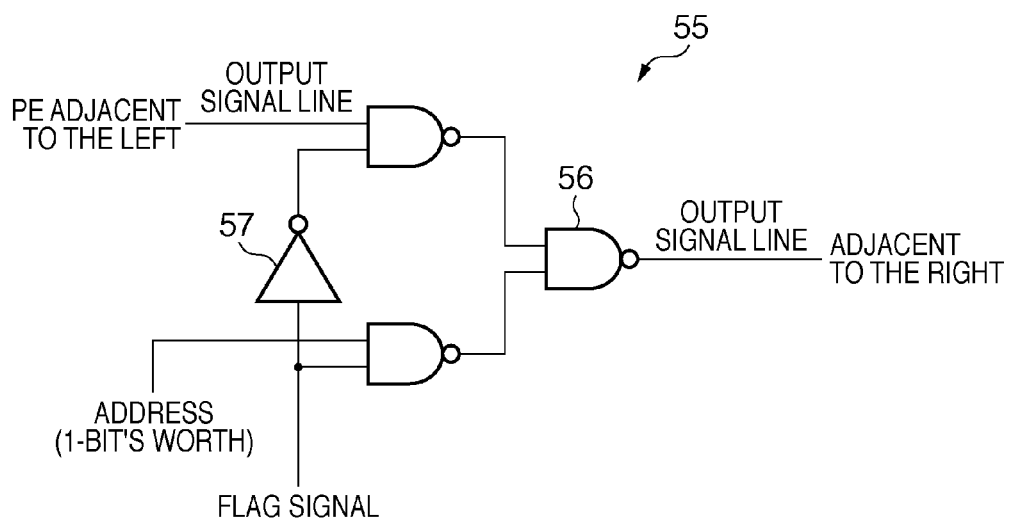

F I G. 24A
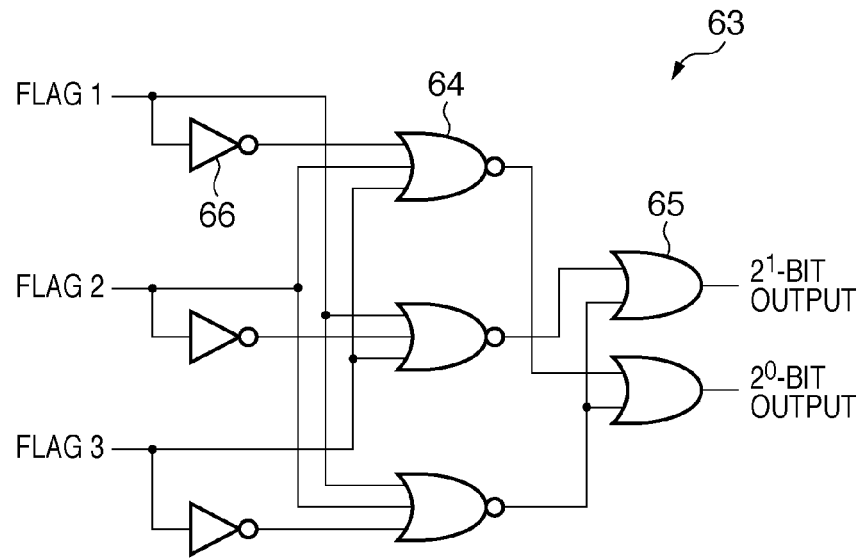
F I G. 24B
TRUTH TABLE
| FLAG 1 | FLAG 2 | FLAG 3 | $2^1$-BIT OUTPUT | $2^0$-BIT OUTPUT |
|---|---|---|---|---|
| 1 | 0 | 0 | 0 | 1 |
| 0 | 1 | 0 | 1 | 0 |
| 0 | 0 | 1 | 1 | 1 |

INFORMATION PROCESSING APPARATUS

TECHNICAL FIELD

The present invention relates to an information processing apparatus, and particularly, to a technique for outputting a plurality of pieces of stored analog information as digital information.

BACKGROUND ART

Configurations are known for respectively converting a plurality of pieces of analog information into digital information and outputting the same. For example, a circuit configuration is known which, in an array processor wherein processor elements (hereinafter PEs) whose result of predetermined processing is referenced as an analog value are mutually connected and arranged, outputs the analog value as a digital value. Analog values to be referenced as a predetermined processing result include, for example, a voltage photoelectrically converted by each pixel cell of a solid-state imaging element (Japanese Patent Laid-Open No. 2005-198149).

In such a configuration, a pixel cell includes: a photo diode as a photoelectric conversion unit; a capacitor as a capacitive element; a comparator as a comparison unit; and a reset switch as a reset unit. In addition, incident light intensity with respect to the pixel cell is referenced as a terminal voltage of the capacitor.

When reading the incident light intensity, a row selection signal line in the solid-state imaging element is selected and a ramp voltage is input from a horizontal signal line. Accordingly, in a solid-state imaging element having pixel cells arranged in a matrix state, incident light intensity of a pixel cell belonging to a row of the matrix is output as a digital signal per each row.

In the conventional technique described above, when obtaining an output signal of a solid-state imaging element constituted by n rows, m columns of pixel cells, processing is executed by inputting a ramp voltage per each row. Therefore, obtaining all values of incident light intensity detected by the solid-state imaging element requires a processing time equal to or exceeding approximately n times the ramp voltage cycle time, resulting in a low operation speed.

DISCLOSURE OF INVENTION

The present invention has been made in consideration of the above problem, and an object thereof is to provide a technique for outputting, at high-speed, a plurality of pieces of stored analog information as digital information.

According to one aspect of the present invention, an information processing apparatus, comprises:

a plurality of processor means respectively including storage means for storing analog information and comparison means for comparing analog information stored in the storage means with an inputted reference analog value;

input means for inputting the reference analog value to the plurality of processor means while changing the reference analog value in synchronization with a clock signal; and counter means for updating a count value in synchronization with the clock signal and outputting the count value when the analog information and the reference analog value become consistent at a corresponding comparison means.

Further features of the present invention will become apparent from the following description of exemplary embodiments (with reference to the attached drawings).

BRIEF DESCRIPTION OF DRAWINGS

FIG. 8A, FIG. 8B, FIG. 8C, FIG. 8D, FIG. 8E, FIG. 8F, FIG. 8G, FIG. 8H and FIG. 8I are schematic diagrams exemplifying steps of processing at a given row of an array processor;

FIG. 9 is a diagram showing an example of a circuit configuration for suspending operation;

FIG. 18 is a schematic diagram showing a detailed circuit configuration example of a processor element;

FIG. 19 is a diagram showing a circuit configuration example of a multiplexer;

FIG. 24A is a diagram showing a configuration example of an encoder circuit; and FIG. 24B is a diagram showing a truth table of an encoder circuit.

BEST MODE FOR CARRYING OUT THE INVENTION

Hereinafter, embodiments of the present invention will be described in detail with reference to the attached drawings. However, it should be understood that the components described in the embodiments are merely exemplary and are not intended to limit the scope of the present invention to such embodiments. In addition, all combinations of the characteristics described in the embodiments are not necessarily essential to the solution of the present invention.

First Embodiment

A first embodiment of the present invention will now be described with reference to the drawings.

(Row Asynchronous Output Circuit)

Figure 1:
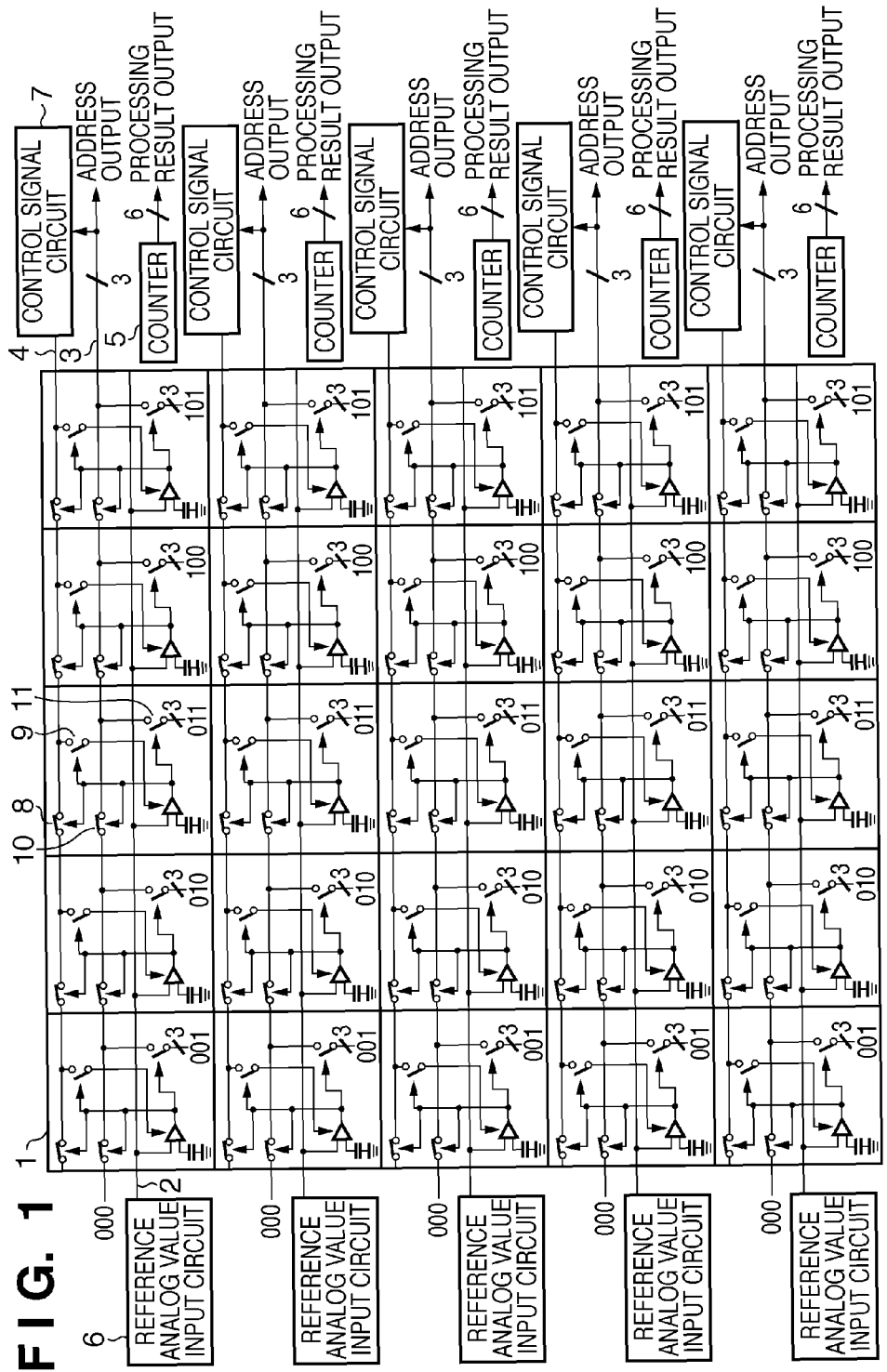
FIG. 1 is a diagram showing a configuration of a row asynchronous output circuit as an array processor.

FIG. 1 is a diagram showing a configuration of a row asynchronous output circuit (information processing apparatus) as an array processor according to the present embodiment. As shown in FIG. 1, a row asynchronous output circuit configuration according to the present invention includes a configuration as an array processor in which a plurality of processor elements (hereinafter PEs) 1 are mutually connected.

While FIG. 1 shows a case where an array processor is configured as a 5-row, 5-column two-dimensional array processor, actual configurations are not limited to this example. For example, any m-row, n-column configuration (where m and n are integers equal to or greater than 1) may be adopted.

As shown in FIG. 1, the array processor respectively includes, in each row, a reference analog value input line 2, an output signal line 3 and a control signal line 4. The output signal line 3 functions as a wiring for outputting address information (identification information) within a row of the PE 1, and is configured as a bus-type wiring to be shared by the PEs 1 of the respective rows.

In addition, as shown in FIG. 1, a counter circuit 5 is arranged per each row at an output terminal side (the right-hand side of the array processor in FIG. 1) of the output signal line 3 of the array processor. Furthermore, a reference analog value input circuit 6 is arranged at an input terminal (the left-hand side of the array processor in FIG. 1) of the reference analog value input line 2 of the array processor. Moreover, a control signal circuit 7 is arranged at an input terminal (the right-hand side of the array processor in FIG. 1) of the control signal line 4 of the array processor. As shown in FIG. 1, connections to the output signal line 3 and the control signal line 4 at each PE 1 are respectively switched via two switches 8 to 11.

(Processor Element)

Figure 2:
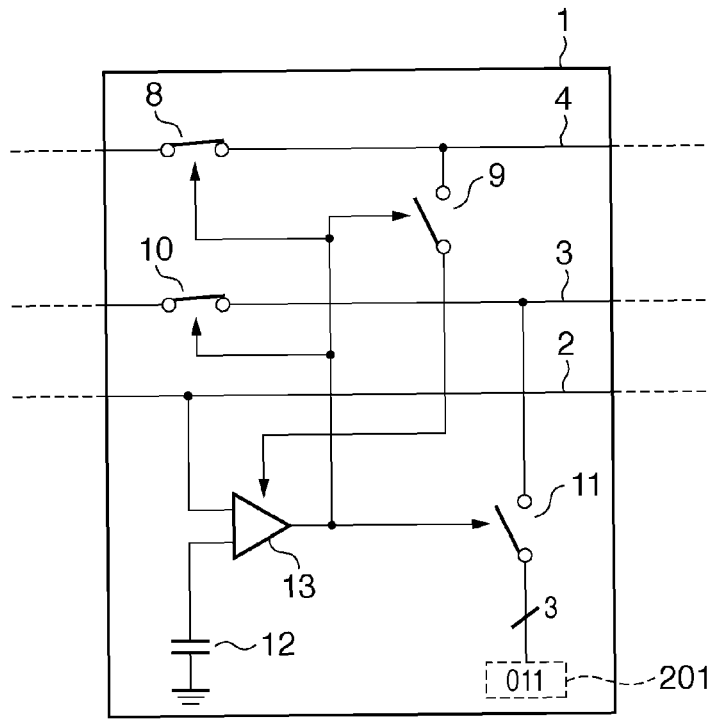
FIG. 2 is a schematic diagram showing a detailed circuit configuration example of a processor element.

Next, a description will be given on a detailed configuration of the processor element (PE) 1 with reference to FIG. 2. FIG. 2 is a schematic diagram showing a detailed circuit configuration example of a single PE 1. As shown in FIG. 2, the PE 1 according to the present embodiment includes a capacitor 12, a comparison circuit 13, and switches 8 to 11.

In the present embodiment, the result of processing by the PEs 1 is retained (stored) as a charge quantity or a voltage value in the capacitor 12 included in each PE 1. In this case, the result of processing by PE 1 refers to the result of processing of analog information of a processing circuit (not shown) connected to the PE 1 and which executes predetermined processing. The processing result is, for example, a computation result or the like of an analog multiplication circuit that outputs a processing result as a charge quantity. Additionally, for example, a result of photoelectric conversion processing of incident light by a photo diode of a solid-state imaging element is conceivable. Again, in this case, the processing result is similarly referenced as a charge quantity or a voltage value accumulated in the capacitor 12. As shown, in the present embodiment, while a processing result of some kind or another is accumulated in the capacitor 12 of the row asynchronous output circuit to be referenced, it should be noted that the contents of the processing will not be considered.

In this manner, since the processing circuit itself for retaining a processing result in the capacitor 12 is not considered in the present embodiment, the processing circuit is not depicted in the drawings. Instead, the drawings only depict processing circuits that are characteristic components of the present embodiment and which are associated with outputting processing results to be referenced as an analog value (analog information).

While the drawings such as FIGS. 1 and 2 depict the capacitor 12 as an independent capacitor element, this depiction is merely for descriptive purposes and no requirements whatsoever are imposed on the processing circuit itself that retains a processing result in the capacitor 12. In other words, the capacitor 12 includes all elements having capacitor functions. For example, in addition to circuit elements such as a two-layer polysilicon capacitor and an MIM (metal insulator metal) capacitor, those using a gate capacity component of a MOS (metal oxide semiconductor) element and the like are also included.

Furthermore, in the present embodiment, as described afterwards, a charge quantity or a voltage value of the capacitor 12 that is a processing result of the PE 1 is read as 6-bit digital data (digital information). Moreover, in regards to reading digital data, resolution is not limited to 6 bits and a desired resolution may be adopted as necessary.

(Reference Analog Value Input Circuit)

Figure 3:
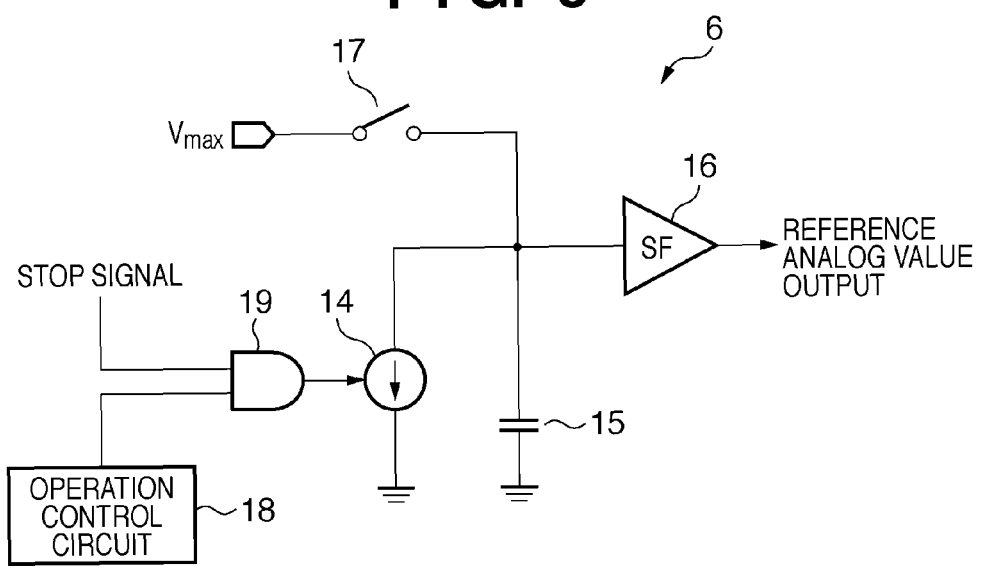
FIG. 3 is a schematic diagram showing a configuration example of a reference analog value input circuit.

Next, the reference analog value input circuit 6 will be described with reference to FIG. 3. FIG. 3 is a schematic diagram showing a configuration example of the reference analog value input circuit 6.

As shown in FIG. 3, the reference analog value input circuit 6 includes a current source 14, a capacitor 15, a source follower circuit 16, a switch 17, an operation control circuit 18, and an AND circuit 19. In the present embodiment, a voltage value is assumed to be the reference analog value. The reference analog value input circuit 6 includes a function for generating a ramp voltage to be used as the reference analog value in the present embodiment and inputting the ramp voltage into reference analog value input lines 2 of the respective lines of the array processor.

When generating a ramp voltage, the reference analog value input circuit 6 first turns on the switch 17 and initializes the terminal voltage of the capacitor 15 to a maximum voltage value $V_{max}$ of the ramp voltage. The reference analog value input circuit 6 next turns off the switch 17, and holds the terminal voltage of the capacitor 15 to the maximum voltage value $V_{max}$ of the ramp voltage. Subsequently, a High signal is input from the operation control circuit 18 to the AND circuit 19. At this point, a High signal is input to the AND circuit 19 as a stop signal. While the stop signal is a signal generated by a flag signal to be described later, a detailed description thereof will be given later. As shown, since inputs to both terminals of the AND circuit 19 are High signals, an output signal of the AND circuit 19 becomes a High signal and is input as a control signal to the current source 14.

In the present embodiment, the current source 14 functions as a constant current source and operates to "draw" a constant current from the capacitor 15 as long as a High signal is input as a control signal. Therefore, the terminal voltage of the capacitor 15 represents a ramp voltage that monotonically decreases with time.

Moreover, ramp voltage not only refers to a voltage that linearly changes with time, and may also include a voltage in which a portion thereof indicates a constant voltage or changes stepwise with time. Specific voltage waveforms will be described later. The terminal voltage (ramp voltage) of the capacitor 15 is input to each row of the processor array via the source follower circuit 16.

As will be described hereinafter, the stop signal actually switches between a High signal and a Low signal in accordance to a comparison processing result (flag signal) at each PE 1. When the stop signal is a Low signal, since a Low signal is input as a control signal to the current source 14 and drawing of a current from the capacitor 15 is stopped, the ramp voltage consequently indicates a constant value with respect to time.

Figure 4:
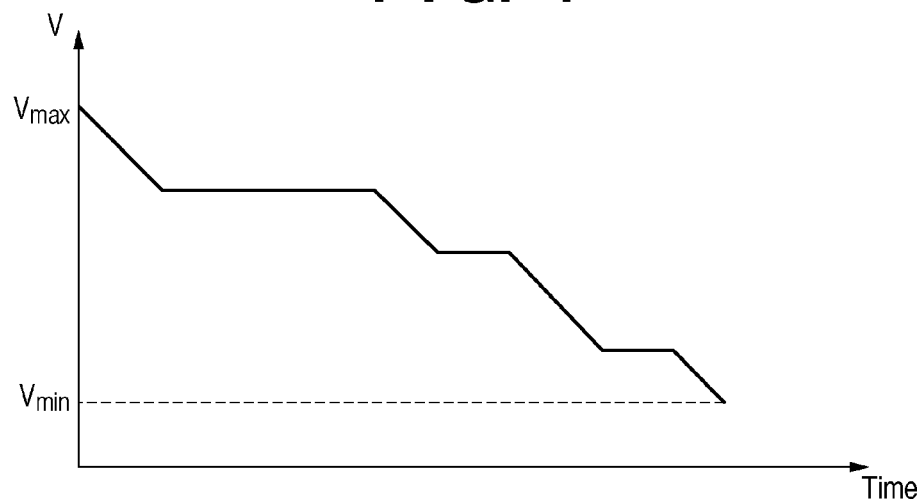
FIG. 4 is a diagram showing a variation example of a ramp voltage.

Therefore, the ramp voltage takes, for example, a waveform having a time variation such as shown in FIG. 4. FIG. 4 is a diagram showing a variation example of a ramp voltage. A charge quantity ΔQ to be drawn by the current during one clock cycle shall be set as expressed by Formula (1).

$$\Delta Q = C(V_{max} - V_{min})/(2^6 - 1) \quad (1)$$

In the formula, reference character C represents a capacity value of the capacitor 15 and $V_{min}$ represents a minimum voltage value of the ramp voltage. As described above, in the present embodiment, processing results are read at a 6-bit resolution. Therefore, the terminal voltage value of the capacitor 15 takes a minimum voltage value $V_{min}$ at the point where the total duration of the High signal input as a control signal to the current source 14 becomes $2^6 - 1 = 63$ clock cycles. A total duration of the High signal refers to a total duration in which the voltage is High.

In other words, a ramp voltage value indicated per each clock cycle corresponds to a voltage value obtained by converting a voltage value of the capacitor 15 corresponding to a processing result of the PE 1 by the 6-bit resolution. The row asynchronous output circuit includes a clock signal generation unit, not shown, which generates clock signals.

The ramp voltage waveform shown in FIG. 4 is merely an example, and various waveform shapes may be taken in accordance with the comparison processing result at each PE 1.

As shown in FIG. 1, the reference analog value input circuit 6 is arranged in each row of the array processor. Each of the reference analog value input circuits 6 generates a ramp voltage and inputs the generated ramp voltage into reference analog value input lines 2 of the respective rows of the array processor.

As described above, while the reference analog value input circuit 6 according to the present embodiment is constituted by a current source, a capacitor, and the like, other circuit configurations may be adopted as long as similar functions are included. For example, digital data corresponding to the aforementioned ramp voltage waveform may be retained in a memory or the like in advance, and by reading and D/A-converting digital data in clock cycles, the digital data may be input to the array processor as an analog voltage.

(Counter Circuit)

Next, the counter circuit 5 will be described. As shown in FIG. 1, the counter circuit 5 is arranged in each row of the array processor, and as described above, commences a count operation in synchronization with the input of the ramp voltage. The counter circuit 5 according to the present embodiment is constituted by a logic circuit, and includes a general function in which, upon commencing operation, countdown is sequentially performed from a maximum value in increments of 1 and the counted down values are output as bit data.

In the present embodiment, the aforementioned clock signal with respect to the operation control circuit 18 that controls the ramp voltage is the same as a clock signal that executes the countdown by the counter circuit 5. In other words, while the reference analog value input circuit 6 generates an analog value in synchronization with the clock signal and inputs the analog value as a reference analog value to the PE 1, the counter circuit 5 also counts count values in synchronization with the clock. The counter circuit 5 sequentially executes countdown from 63, corresponding to the maximum voltage value $V_{max}$ of the ramp voltage, to 0, corresponding to the minimum voltage value $V_{min}$ thereof.

In addition, the countdown operation of the counter circuit 5 is executed when the control signal input to the current source 14 of the reference analog value input circuit 6 is a High signal, and the countdown operation is suspended when the input signal is a Low signal.

As described above, the operation of the reference analog value input circuit 6 that generates a ramp voltage and the operation of counter circuit 5 are synchronized per each row of the array processor. Therefore, using an output value of the counter circuit 5, it is now possible to reference a value obtained by converting a voltage value of the ramp voltage to a digital value at a 6-bit resolution. While the counter circuit 5 according to the present embodiment is configured as described above, other circuit configurations may be adopted as long as similar functions are included.

(Comparison Circuit)

Next, operations of the comparison circuit 13 in the PE 1 will be described. The comparison circuit 13 according to the present embodiment is constituted by a voltage comparison-type comparator, and when the ramp voltage is input to each row of the array processor, the comparator executes comparison processing between voltage values of the ramp voltage and the capacitor 12. The comparator compares the voltage value $V_C$ of the capacitor 12 with the voltage value of the ramp voltage $V_R$, and when the voltage value of the ramp voltage falls below the voltage value of the capacitor 12, outputs a High signal as a flag signal.

It should be noted that, in the present description, a voltage level shift by the source follower circuit to be described later has not been taken into consideration. Instead, an essential concept of comparison processing in regards to the voltage value $V_C$ of the capacitor 12 and the voltage value of the ramp voltage $V_R$ is described. In actuality, a comparison of the two voltages is performed in consideration of a voltage level shift by the source follower circuit.

Figure 5:
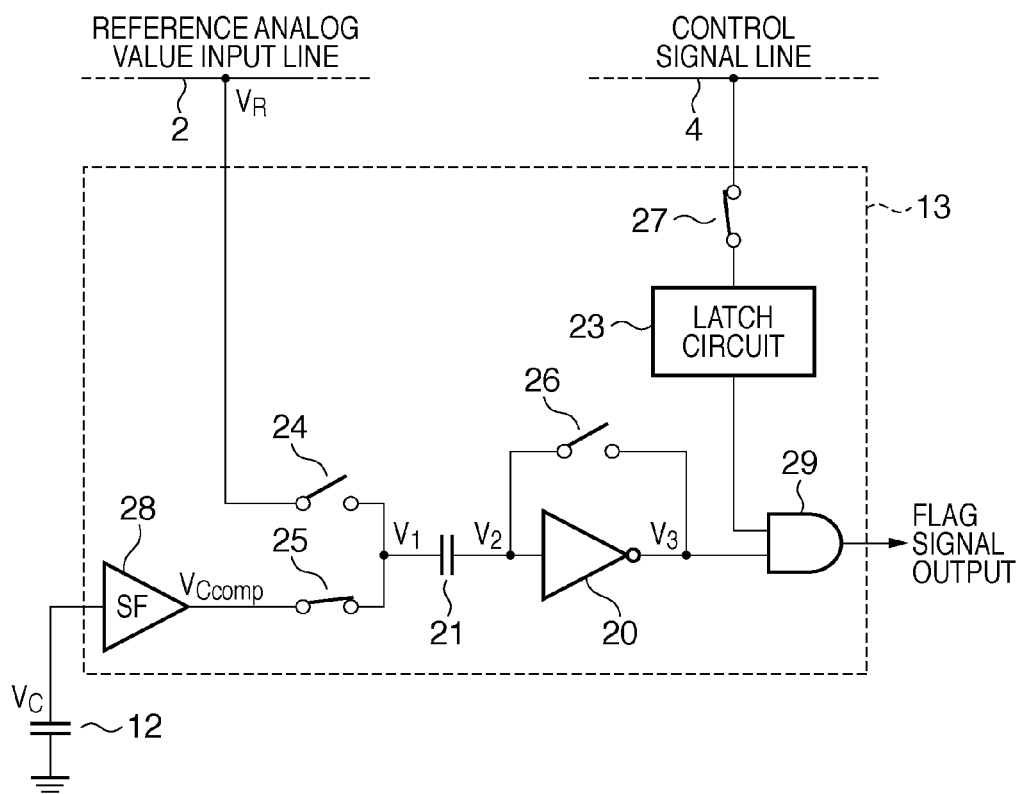
FIG. 5 is a diagram showing a configuration example of a comparator as a comparison circuit.

Comparison processing by the comparator will now be described in detail using FIG. 5. FIG. 5 is a diagram showing a configuration example of a comparator as the comparison circuit 13.

As shown in FIG. 5, the comparator according to the present embodiment is configured as a chopper-type comparator. The comparator includes an inverter 20, a capacitor 21, a latch circuit 23, switches 24 to 27, a source follower circuit 28, and an AND circuit 29.

Comparison processing by the comparator will be described in due order. First, in an initial state, the latch circuit 23 retains a High signal, and outputs the High signal to the AND circuit 29.

Next, both ends of the inverter 20 are short-circuited by turning on the switch 26, whereby respective terminal voltages $V_2$ and $V_3$ of the input and output of the inverter 20 is set to a threshold value voltage $V_{thinv}$ of the inverter 20 as expressed by Formula 2:

$$V_2 = V_3 = V_{thinv} \quad (2)$$

Next, by turning on the switch 25 while keeping the switch 26 turned on, a voltage value of the capacitor 12 that retains a processing result of each PE 1 as a charge quantity or a voltage value is input to the capacitor 21 via the source follower circuit 28 and is retained therein. Here, since the source follower circuit 28 generally causes a voltage level shift, an output voltage value of the source follower circuit 28 is assumed to be $V_{Ccomp}$.

At this point, the potential difference between potentials of both electrodes of the capacitor 21, namely $V_1$ and $V_2$, may be expressed by Formula (3) below:

$$V_1 - V_2 = V_{Ccomp} - V_{thinv} \quad (3)$$

Next, the switches 25 and 26 are turned off. Consequently, the electrodes on both ends of the capacitor 21 become floating nodes and hold the potential difference between the electrodes.

Next, the switch 24 is turned on to input the ramp voltage value to be input to each row of the array processor as described above to one of the terminals of the capacitor 21. Assuming that the voltage value of the ramp voltage (reference analog value) is $V_R$, Formula 4 below is true.

$$V_1 - V_2 = V_R - V_2 = V_{Ccomp} - V_{thinv} \quad (4)$$

Therefore, when $V_R > V_{Ccomp}$, $V_2 > V_{thinv}$ is true and the output of the inverter 20 becomes a Low signal. In addition, when $V_R \leqq V_{Ccomp}$, $V_2 > V_{thinv}$ the output of the inverter 20 becomes a High signal.

Here, the output of the inverter 20 is the input to the AND circuit 29, and as described above, the output of the latch circuit 23 is a High signal. Therefore, as a result, the output of the AND circuit 29 becomes a High signal.

The output signal of the AND circuit 29 functions as a flag signal in accordance with a comparison processing result. Consequently, it is now possible to reference a PE 1 in which the ramp voltage and the voltage of the capacitor 12 had become consistent.

The maximum voltage value $V_{max}$ and the minimum voltage value $V_{min}$ of the ramp voltage are set in consideration of an amount of level shift caused by the source follower circuit 28.

In addition, at the comparator, when a High signal is input to the control signal line 4, the latch circuit 23 connected via the switch 27 (turned on at this point; a detailed description will be given later) to the control signal line 4 is reset, and the output of the latch circuit 23 becomes a Low signal. Consequently, the output signal (i.e., flag signal) of the AND circuit 29 becomes a Low signal.

It should be noted that, in regards to the latch circuit 23 shown in FIG. 5, depictions of data input terminals and clock input terminals have been omitted for the sake of facilitating understanding towards functions related to the present embodiment. The above-described functions of the comparison circuit 13 will be described once again when describing the entire operation of the array processor.

(Operations of the Array Processor)

Figure 6:
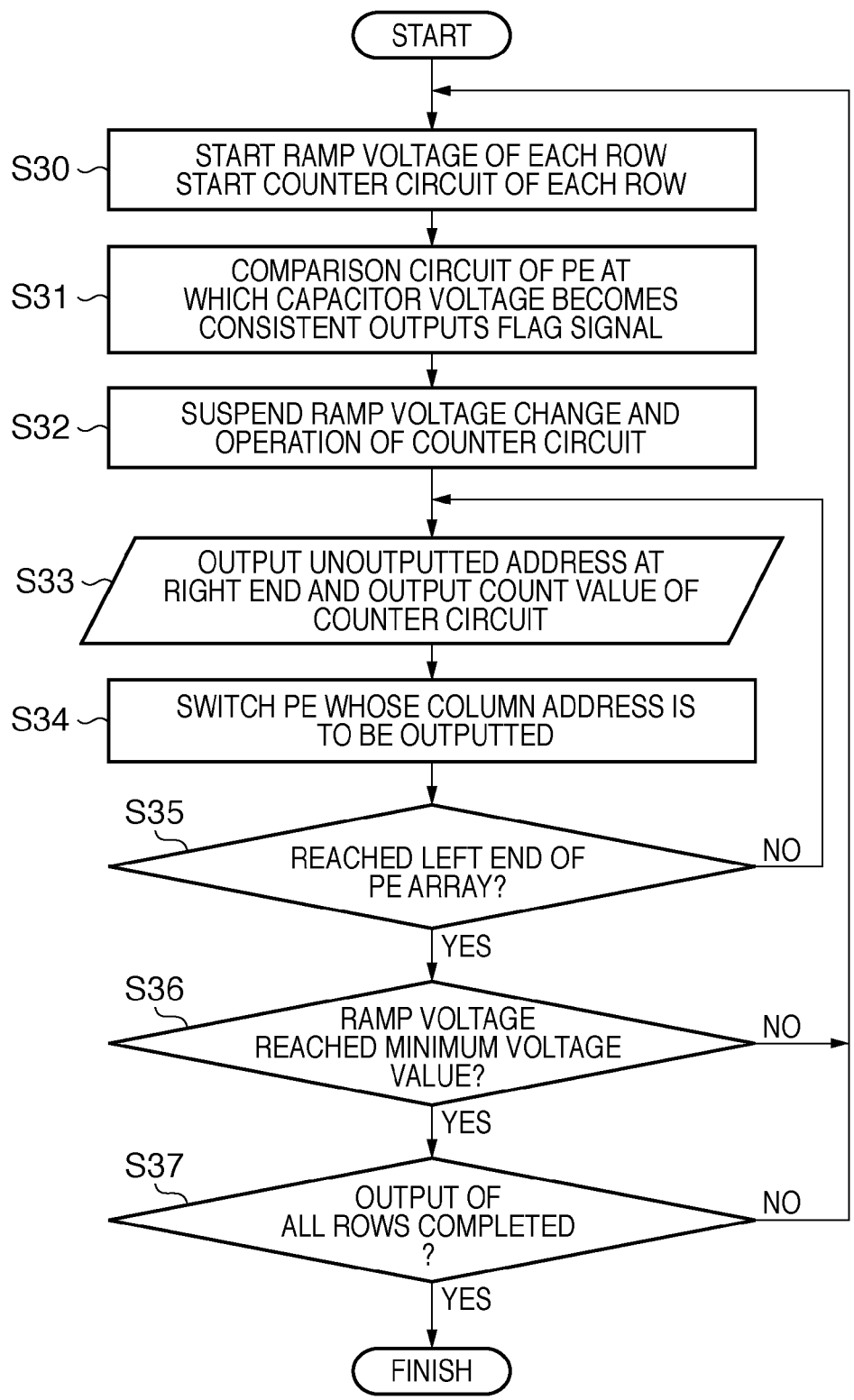
FIG. 6 is a flowchart showing a flow of processing of an array processor.

Next, a description will be given on operations of the entire array processor. FIG. 6 is a flowchart showing a flow of processing of the array processor according to the present embodiment. In addition, FIGS. 8A, 8B, 8C, 8D, 8E, 8F, 8G, 8H and 8I are schematic diagrams exemplifying steps of processing at a given row of the array processor.

First, an initial state of the array processor will be described. As shown in FIG. 1, each row of the array processor includes the reference analog value input circuit 6 to which a reference analog signal is input. Similarly, each row of the array processor includes the counter circuit 5. In addition, each row of the respective PEs 1 (reference numerals 81 to 85) includes the bus-type output signal line 3 that outputs a column address of the PE 1, and connection in the PE 1 is controlled via the switches 10 and 11.

In the case of the present embodiment, since the array processor has an array size of 5×5 and a column address is expressed by 3 bits, the output signal line 3 is also constituted by three wirings in correspondence with 3-bit data. In order to avoid complication, the output signal line is shown in the diagram as a wiring having a bit width of 3 bits. It is needless to say that the bit width of the output signal line 3 may be appropriately set according to the array size of the array processor.

While the output signal line 3 is to be connected to an address memory circuit 201 that retains a column address of each PE 1, a column address of each PE 1 in the array processor has been determined. For this reason, the address memory circuit 201 according to the present embodiment appropriately connects wirings connected via the switch 11 to power supply lines and ground lines so that respective column addresses are expressed in each PE 1 in 3 bits. For example, in FIGS. 1, 2, 8A, 8B, 8C, 8D, 8E, 8F, 8G, 8H and 8I, column addresses are represented as bit strings such as 001.

In addition, each PE 1 respectively includes the bus-type output signal line 4 for controlling flag signal output of the PE 1, and connection in the PE 1 is controlled via the switches 8 and 9.

Figure 7:
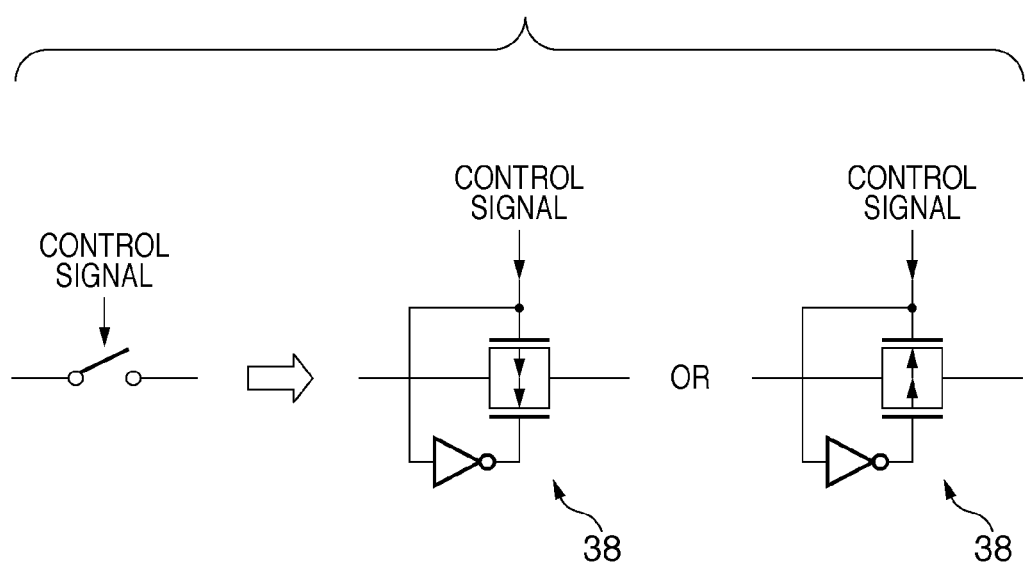
FIG. 7 is a schematic diagram showing a configuration example of a switch.

In the case of the present embodiment, as shown in FIG. 7, the switches 8 to 11 include a CMOS transmission gate (hereinafter TG). FIG. 7 is a schematic diagram showing a configuration example of a switch.

Figure 8A:
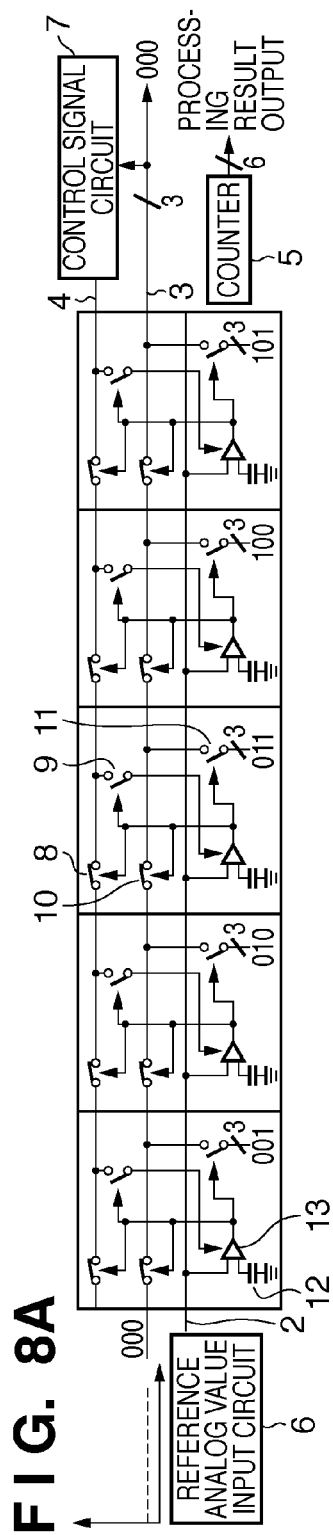

With the bus-type output signal line 3 in each PE 1, in an initial stage, as shown in FIG. 8A, all of the switches 10 between adjacent PEs 1 have been turned on while all of the switches 11 connected to address data within the PEs 1 have been turned off. As shown in FIG. 8A, since the left end of the output signal line 3 is connected to a ground terminal, in an initial state, the output address of the output signal line 3 is represented in bits as 000.

In order to distinguish from initial-state output addresses, values ranging from 001 to 101 are used as column addresses according to the present embodiment. In addition, with the control signal line 4 that inputs a control signal, as shown in FIG. 8A, all of the switches 8 between adjacent PEs 1 have been turned on while all of the switches 9 connected to the comparison circuit 13 have been turned off.

Next, operations of the array processor configured as described above will be described. As the ramp voltage (reference analog value) is input to each row of the array processor from the reference analog value input circuit 6, the array processor commences a countdown operation of the counter circuit 5 of each row (process S30 in FIG. 6).

As described above, the ramp voltage according to the present embodiment has a voltage waveform that monotonically decreases with time. The ramp voltage is commonly input to the PE 1 for each row, and within each PE 1, becomes a reference voltage with respect to the comparison circuit 13. In this case, in the course of the ramp voltage monotonically decreasing with time, when the voltage value of the capacitor 12 becomes consistent with the voltage value of the ramp voltage, the comparison circuit 13 of the PE 1 outputs a High signal. The High signal becomes a flag signal indicating consistency of the ramp voltage value and the voltage value of the capacitor 12 (process S31 in FIG. 6).

Figure 8B:
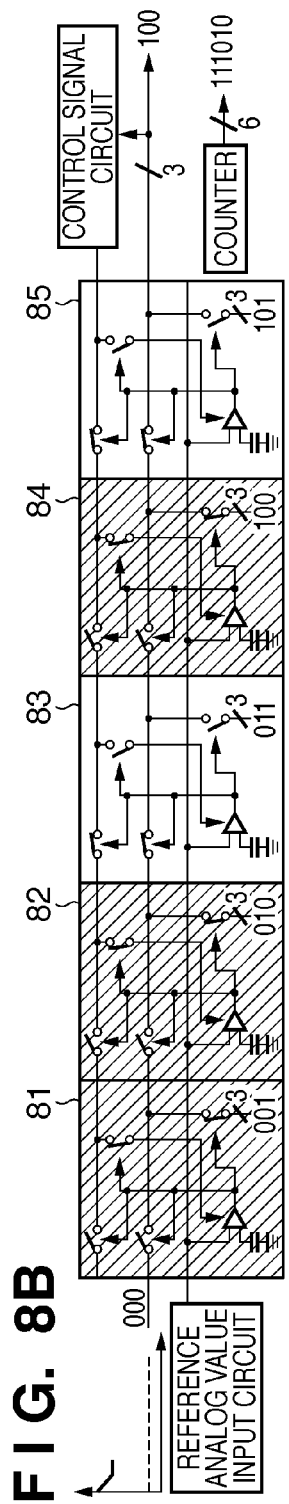

FIG. 8B shows a case where the flag signal becomes a High signal in, for example, three PEs 1 (81, 82 and 84). In FIG. 8B, the three PEs 1 (81, 82 and 84) in which the flag signal becomes a High signal are shown shaded.

While a difference corresponding to a level shift amount by the source follower circuit 28 actually exists as described above between the voltage value of the capacitor 12 and the voltage value of the ramp voltage in the PE 1, the processing is essentially intended to compare the voltage value of the capacitor 12 with the ramp voltage. Accordingly, in this case, the voltage difference corresponding to the amount of level shift will not be considered and a description will be given on the assumption that both voltage values are consistent.

When the flag signal is High, the ramp voltage change by the reference analog value input circuit 6 and operations of the counter circuit 5 are suspended (process S32 in FIG. 6). In the case where the flag signal becomes a High signal, a circuit configuration enabling suspension of operations of the reference analog value input circuit 6 and the counter circuit 5 can be realized by, for example, the circuit configuration shown in FIG. 9. FIG. 9 is a diagram showing an example of a circuit configuration for suspending operations.

In FIG. 9, a dynamic NOR circuit 39 configured in each row takes the flag signal of each PE 1 as input. Therefore, in the case where any of the flag signals in the PE 1 of each row is a High signal, the dynamic NOR circuit 39 outputs a Low signal. The Low signal to be output from the dynamic NOR circuit 39 becomes a stop signal for controlling operations of the aforementioned reference analog value input circuit 6 and the counter circuit 5. Therefore, due to the input of the output signal (Low signal) of the dynamic NOR circuit 39, as described earlier with reference to FIG. 3, the reference analog value input circuit 6 and the counter circuit 5 are now capable of suspending their operations.

In FIG. 9, in order to avoid complications, circuit configurations in the PE 1 other than the dynamic NOR circuit 39 have been omitted.

While a configuration has been described above in which, when any of the flag signals takes a High level per each row, the reference analog value input circuit 6 and the counter circuit 5 of a corresponding row are suspended, configurations are not limited thereto. For example, a leading edge of a clock signal that drives the reference analog value input circuit 6 and the counter circuit 5 may be synchronized with a stop signal per each row, whereby the signal suspends the reference analog value input circuit 6 and the counter circuit 5 of a corresponding row. In this case, the suspension operation of the reference analog value input circuit 6 and the counter circuit 5 is executed in synchronization with the clock signal. Therefore, since an output value of the counter circuit 5 actually includes discrete values, comparison processing corresponding to a unit voltage width of the ramp voltage corresponding to the respective discrete values is to be consecutively executed. In other words, comparison processing within a range of a predetermined analog value width is to be consecutively executed.

In the present embodiment, while a circuit configuration in which a flag signal suspends the reference analog value input circuit 6 and the counter circuit 5 has been configured as described above, other circuit configurations may be adopted as long as similar functions are included. In other words, a configuration in which the operations of the reference analog value input circuit 6 and the counter circuit 5 are suspended, as well as operations thereof, can be designed without any inhibition in accordance to necessary processing.

Subsequently, at the PE 1 where the flag signal has risen, the switch 11 is turned on by the flag signal to connect the address memory circuit 201 to the output signal line 3, and the switch 10 is turned off to terminate the connection to the PE 1 on the left-hand side of the output signal line 3 (step S32 in FIG. 6). At the same time, at the PE 1 where the flag signal has risen, the control signal line 4 is connected to the comparison circuit 13 by switching the flag signal and turning on the switch 9, and the switch 8 is turned off to terminate the connection with the PE 1 on the left-hand side of the control signal line (step S32).

For example, a case will now be considered where, as shown in FIG. 8B, the flag signal has risen at a plurality of PEs 1 (81, 82, 84) in a given row. In this case, in step S32, each PE 1 at which the flag signal has risen terminates connection to the PE 1 on the left-hand side of the output signal line 3. Consequently, only the address memory circuit 201 of the rightmost PE 1 (84) among the PEs 1 at which the flag signal has risen is connected to the output terminal of the output signal line 3, and a column address corresponding to the PE 1 (84) is output as the output value of the array processor for this row.

In addition, the suspended counter circuit 5 outputs a count value of its suspended state as a digital value of the processing result of the PE 1 corresponding to the column address (step S33 in FIG. 6). FIG. 8B shows the counter output value as 111010.

As described, by associating and outputting the column address and the value of the counter circuit 5 of each PE 1, it is now possible to obtain a processing result of each PE 1 constituting the array processor as an output value of the counter circuit 5. A row address of each PE 1 is already determined by the time the array processor is configured.

For example, the output column address and the output value of the counter circuit 5 may be retained in a memory together with the row address of the corresponding PE 1 and/or input to an external circuit, and can be appropriately used in order to realize desired processing.

Figure 8C:
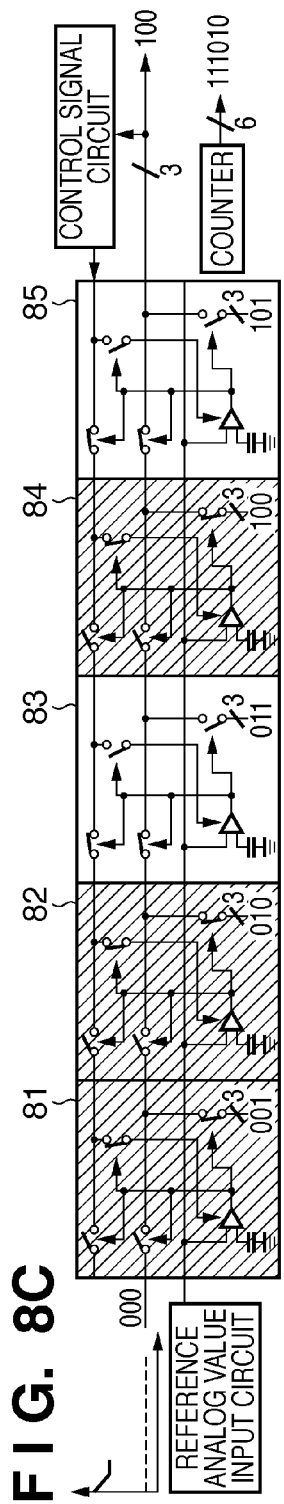

Next, as an address value is output, as shown in FIG. 8C, the control signal circuit 7 having detected the output of the address value transmits a control signal towards the left of the control signal line 4. The control signal is input to the PE 1 (84 in the example shown in FIG. 8C) which had output the address value, and as described in the section titled (Comparison circuit), the flag signal that is the output signal of the comparison circuit 13 in the PE 1 is dropped.

With the control signal circuit 7, an address comparator compares, for example, the output address value with an address value 000 (a default address value that is the address of neither PE 1), whereby the control signal circuit 7 detects an address value output in the case where the two are not consistent. A configuration is possible in which a High signal is output as a control signal. However, the control signal circuit 7 is not limited to the above, and other circuit configurations may be adopted as long as similar functions can be realized.

Alternatively, the control signal may be configured so as to be generated in a predetermined clock cycle after the flag signal has risen. In this case, at the comparison circuit 13, when a High signal is input to the control signal line 4, the latch circuit 23 connected via the switch 27 to the control signal line 4 is reset, and the output of the latch circuit 23 becomes a Low signal. Consequently, the output signal (i.e., flag signal) of the comparison circuit 13 becomes a Low signal.

The control signal generated at the timing described above is timing-adjusted so that the control signal is only input to the PE 1 (84 in the example shown in FIG. 8B) which had last output an address signal. Therefore, even if the connection status of the control signal line 4 changes after the flag signal at the PE 1 that had last output an address signal drops, the control signal will not be input to another PE 1 in addition to the PE 1 that had last output an address signal.

When the flag signal of the PE 1 having completed output of a column address is dropped as described above, the connection state of the output signal line 3 and each PE 1 is changed as shown in FIG. 8D (step S34 in FIG. 6). In other words, as is obvious from FIG. 8D, the position of the PE 1 to be connected to the output signal line 3 moves to the position of the next PE 1 (82 in the example shown in FIG. 8D) as seen from the right at which a flag signal has risen and the corresponding column address is output.

It is assumed that the column addresses of PEs 1 already output at this point have been subjected to necessary processing such as retention in an external memory. In addition, at this point, similar to when the column address of the previous PE 1 was output, the suspended counter circuit 5 outputs a count value in the suspended state as a digital value of the processing result of the PE 1 corresponding to the column address.

Furthermore, when an address value is output, a control signal is transmitted through the control signal line 4 towards the left in a similar manner to when the column address of the previous PE 1 was output. The flag signal of the PE 1 (82 in the example shown in FIG. 8D) that had just output an address is dropped (FIGS. 8E and 8F).

After the above processing is executed on all PEs 1 at which flag signals have risen, as shown in FIG. 8G, the output signal line 3 is connected to the left-end terminal and an address 000 is output in a similar manner as in the initial state. As a result, a control signal is transmitted through the control signal line 4 in a similar manner as described above. At this point, since the control signal line 4 is also connected to the left-end terminal in a similar manner as in the initial state, the control signal reaches the left end of the PE 1 (YES in step S35).

When the control signal reaches the left end of the PE 1, it is accordingly determined that all processing on a given output value (a given voltage value of the ramp voltage) of the relevant row has been concluded. Therefore, suspended operations of the reference analog value input circuit 6 and the counter circuit 5 are recommenced to continue comparison processing on the PE 1 of the relevant row. Alternatively, the control signal circuit 7 may compare the address output value with address value 000 (default address value) to determine that all processing on a given output value (a given voltage value of the ramp voltage) of the relevant row has been concluded if both values are consistent.

A Low signal is then input as a clock signal from the control signal circuit 7 to the aforementioned dynamic NOR circuit shown in FIG. 9 to perform a precharge, whereby the stop signal takes a High level. Consequently, suspended operations of the reference analog value input circuit 6 and the counter circuit 5 can be recommenced to continue comparison processing on the PE 1 of the relevant row. In other words, at the point where no more PEs 1 remain at which the flag signal is a High signal, the aforementioned stop signal becomes a High signal and the reference analog value input circuit 6 and the counter circuit 5 recommence their operations.

At a PE 1 including a capacitor 12 having indicated a voltage value consistent with the ramp voltage and which has already completed output of a column address, the output of the latch circuit 23 maintains a Low signal. Therefore, the flag signal will not become a High signal in subsequent comparison processing.

The processing described above corresponds to a case where, when the flag signal rises in a plurality of PEs 1, output of address data from the respective PEs 1 is arbitrated and sequential output is performed. Therefore, as long as the above-described functions can be realized, respective circuit configurations and operations may take other forms.

Subsequently, as shown in FIG. 8H, the operations of the reference analog value input circuit 6 and the counter circuit 5 are recommenced, and as the ramp voltage decreases, the flag signal becomes a High signal at a PE 1 including a capacitor 12 indicating the same voltage value in a similar manner as described above. In accordance thereto, the aforementioned column address output processing is executed (steps S30 to S35 in FIG. 6).

By performing the processing described above until the ramp voltage indicates the minimum voltage value (YES in step S36), as shown in FIG. 8I, the output processing of processing results of all PEs 1 in a given row is completed (step S36 in FIG. 6).

Furthermore, by performing the processing described above on the respective rows of the array processor, the output processing of processing results of all PEs 1 is completed (step S37 in FIG. 6).

Figure 10:
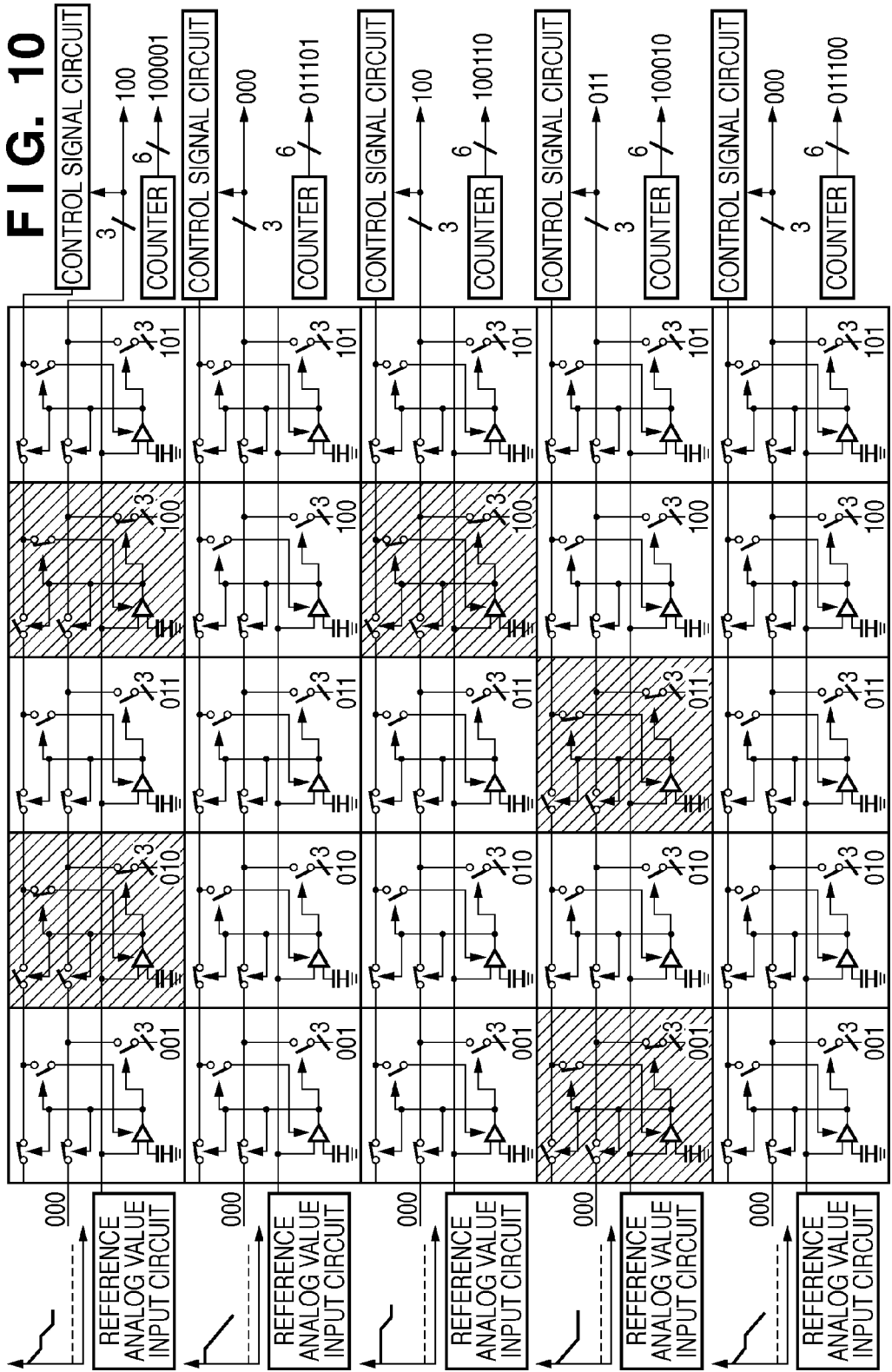
FIG. 10 is a diagram showing an operation example of an array processor.

As described above, the configuration according to the present embodiment executes processing independently per each row of the array processor as shown in FIG. 10. FIG. 10 is a diagram showing an operation example of the array processor according to the present embodiment. Consequently, it is now possible to execute analog/digital conversion processing at each row in parallel and in an asynchronous manner. Therefore, with the configuration according to the present embodiment, it is now possible to convert a plurality of pieces of digital information into analog information at high speed and output processing results of the array processor at high speed.

In the configuration described above, while processing was performed on each of a plurality of PEs 1 arranged in a matrix state and which belong to the same row of the matrix, the present invention is not limited thereto. In other words, any configuration may be adopted as long as a plurality of PEs 1 is grouped into a plurality of groups and a reference analog value is input and analog/digital conversion is performed independently for each group. For example, in the case where PEs 1 existing in the same column are grouped into the same group or where an row asynchronous output circuit has a multilayer structure, processing may be performed for each group by, for example, grouping PEs 1 existing at the same position in the respective layers into the same group.

Furthermore, in the present embodiment, the reference analog value input circuit 6 generates a monotonically-decreasing reference analog value and outputs as a digital value a counter value immediately after the reference analog value falls below a value stored in the capacitor 12. However, this is essentially equivalent to a timing where analog information stored in the capacitor 12 becomes consistent with the reference analog value. In other words, since the configuration described above operates in synchronization with a clock, a digital value is output immediately after the reference analog value falls below a value stored in the capacitor 12. Therefore, if it is essentially discernible that the digital value is output at a timing at which analog information stored in the capacitor 12 becomes consistent with the reference analog value, the timing at which the digital value is output can be appropriately designed according to implementation. For example, in the case of a timing immediately prior to the reference analog value falling below a value stored in the capacitor 12 or when the reference analog value is to be monotonically increased, a timing immediately after the reference analog value exceeds the value stored in the capacitor 12 may be adopted.

Second Embodiment

Figure 11:
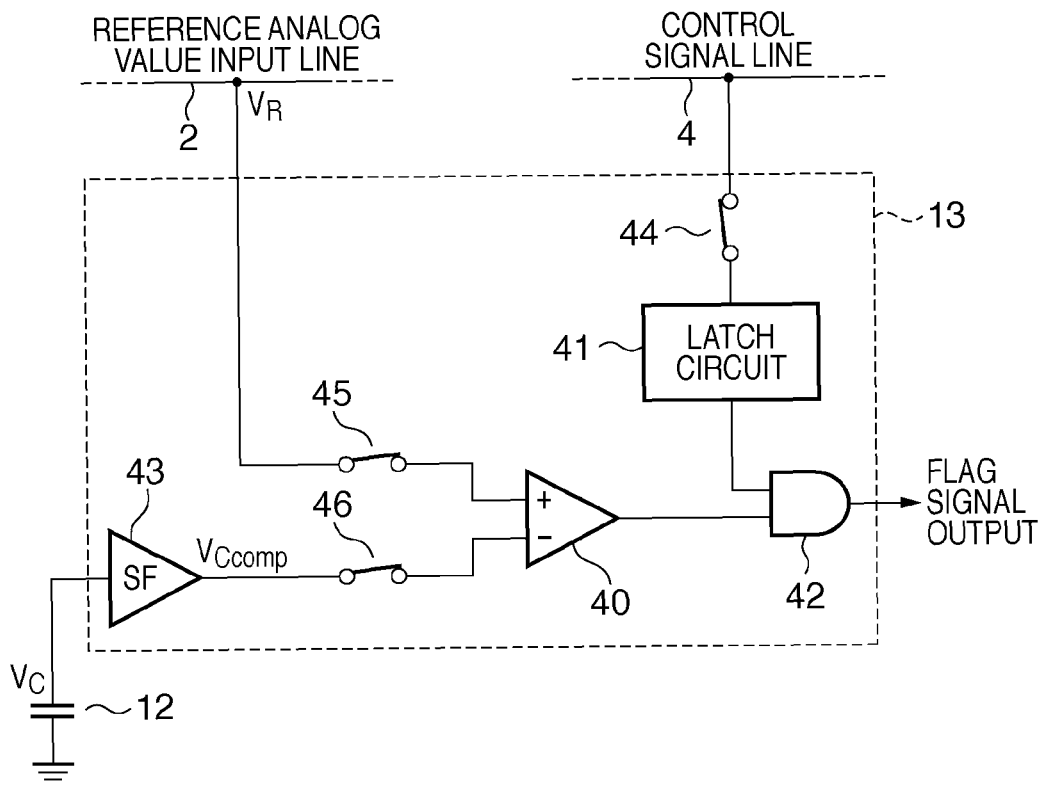
FIG. 11 is a diagram showing a circuit configuration example of a comparison circuit.

Next, a second embodiment of the present invention will be described with reference to the drawings. A row asynchronous output circuit configuration according to the present embodiment differs from the first embodiment in the circuit configuration of the comparison circuit 13. FIG. 11 is a diagram showing a circuit configuration example of the comparison circuit 13 according to the present embodiment.

With the sole exception of the difference in circuit configuration of the comparison circuit 13 at the PE 1, the row asynchronous output circuit configuration according to the present embodiment is similar to the row asynchronous output circuit configuration described in the first embodiment. As such, for the present embodiment, only differences with the row asynchronous output circuit configuration according to the first embodiment shall be described, and other portions shall be assumed to be similar to those as the first embodiment and descriptions thereof shall be omitted.

As shown in FIG. 11, the comparison circuit 13 according to the present embodiment is a voltage comparison-type comparator, and includes an operational amplifier 40, a latch circuit 41, an AND circuit 42, a source follower circuit 43, and switches 44 to 46. Comparison processing by the present comparator will be described in due order.

First, in an initial state, the latch circuit 41 retains a High signal, and outputs the High signal to the AND circuit 42 shown in FIG. 11. In addition, an input terminal − of the operational amplifier 40 inputs a voltage value $V_C$ of the capacitor 12, which retains a processing result of each PE 1 as a charge quantity or a voltage value, as voltage $V_{Ccomp}$ via the source follower circuit 43. Furthermore, in a manner similar to that described in the first embodiment, an input terminal + of the operational amplifier 40 inputs a ramp voltage value $V_R$ to be input per each row of the array processor.

Since the operational amplifier 40 includes a function for amplifying a voltage difference between both input terminals, even the slightest difference in the input voltages causes the output voltage to become either a High signal or a Low signal. In other words, when $V_R > V_{Ccomp}$, the output of the comparator becomes a Low signal, and when $V_R \leq V_{Ccomp}$, the output of the comparator becomes a High signal. Therefore, the output signal of the present comparator functions in a similar manner as the flag signal resulting from comparison processing described in the first embodiment, which in turn enables reference of a PE 1 at which the ramp voltage and the voltage of the capacitor 12 are consistent.

In addition, at the comparator (comparison circuit 13), when a High signal is input to the control signal line 4, the latch circuit 41 of the comparator in the PE 1 that is connected via the switch 44 to the control signal line 4 is reset, and the output of the latch circuit 41 becomes a Low signal. Consequently, the output signal (i.e., flag signal) of the AND circuit 42 becomes a Low signal. This operation is similar to that of the first embodiment.

Since other circuit configurations and circuit operations according to the present embodiment are similar to those of the first embodiment, descriptions thereof shall be omitted.

As described above, the configuration of the comparison circuit 13 is not limited to that exemplified in FIG. 5, and a configuration such as that described in the present embodiment may be adopted as long as similar functions are provided.

In the present embodiment, while the voltage value $V_C$ of the capacitor 12 is input via the source follower circuit 43, the voltage value $V_C$ of the capacitor 12 may be directly input to the input terminal − of the operational amplifier 40 instead of via the source follower circuit 43. In this case, since a voltage level shift due to the source follower circuit 43 does not occur, the ramp voltage to be used as a comparison criterion is assumed to be a value from which the influence of the level shift has been subtracted. Whether or not the voltage value of the capacitor 12 is input via the source follower circuit 43 can be appropriately changed depending on implementation status.

While the comparator is constituted by a chopper-type comparator in the first embodiment and by an operational amplifier in the present embodiment, other circuit configurations may be used as long as similar comparison processing can be executed. For example, similar functions can be realized using a latch-type comparator.

Furthermore, the aforementioned flag signal may be generated by drawing or accumulating a charge corresponding to a processing result retained in the capacitor 12 using a constant current source configured for each PE 1 and by comparing the charge with a predetermined voltage using the comparison circuit 13. Moreover, while a detailed description will be omitted in the present embodiment, a processing result of each PE 1 may be referenced as a current value, whereby comparison is performed also using a current value as the reference analog value. In other words, as described earlier, as long as a processing result of a PE 1 can be compared as an analog value, any circuit configuration may be adopted regardless of configuration or method thereof.

As described above, the row asynchronous output circuit according to the present embodiment enables high-speed output of processing results of an array processor.

Third Embodiment

Next, a third embodiment of the present invention will now be described with reference to the drawings. With a row asynchronous output circuit configuration according to the present embodiment, the reference analog value input circuit 6, the counter circuit 5 and the comparison circuit 13 according to the first embodiment have been replaced with different circuit configurations.

(Reference Analog Value Input Circuit)

Figure 12:
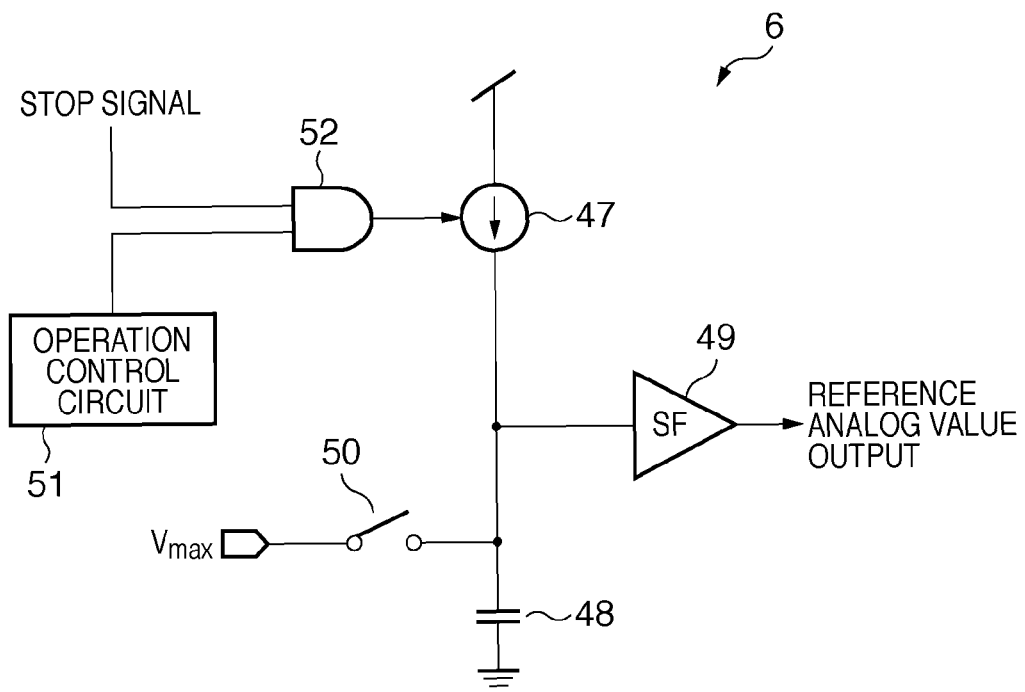
FIG. 12 is a diagram showing a configuration example of a reference analog value input circuit.

FIG. 12 is a diagram showing a circuit configuration example of the reference analog value input circuit 6 according to the present embodiment. As shown in FIG. 12, the reference analog value input circuit 6 includes a current source 47, a capacitor 48, a source follower circuit 49, a switch 50, an operation control circuit 51, and an AND circuit 52.

The reference analog value input circuit 6 according to the present embodiment generates a ramp voltage to become a reference analog value and inputs the ramp voltage to each row of an array processor in a similar manner to the first embodiment. In addition, with the exception of the differences in circuit configurations of the reference analog value input circuit 6, the counter circuit 5 and the comparison circuit 13, the row asynchronous output circuit configuration according to the present embodiment is similar to the row asynchronous output circuit configuration described in the first embodiment. Therefore, for the present embodiment, descriptions will only be given on the reference analog value input circuit 6, the counter circuit 5 and the comparison circuit 13 which differ from the row asynchronous output circuit configuration described in the first embodiment, and descriptions on other portions shall be omitted.

In FIG. 12, when generating a ramp voltage, first, the switch 50 is turned on and the terminal voltage of the capacitor 48 is initialized to a minimum voltage value $V_{min}$ of the ramp voltage. Next, the switch 50 is turned off and the terminal voltage of the capacitor 48 is held to the minimum voltage value $V_{min}$ of the ramp voltage.

Subsequently, a High signal is input from the operation control circuit 51 to the AND circuit 52. At this point, a High signal has been input to the AND circuit 52 as a stop signal. As described in the first embodiment, the stop signal is a signal generated by a flag signal. Since inputs to both terminals of the AND circuit 52 are High signals as described above, an output signal of the AND circuit 52 becomes a High signal and is input as a control signal to the current source 47.

In the present embodiment, the current source 47 functions as a constant current source and outputs a constant current to the capacitor 48 as long as a High signal is input as a control signal. Therefore, the terminal voltage of the capacitor 48 represents a ramp voltage that monotonically increases with time. In this case, ramp voltage not only refers to a voltage that linearly changes with time, and may also include a voltage in which a portion thereof indicates a constant voltage or changes stepwise with time. Specific voltage waveforms will be presented below.

The terminal voltage (ramp voltage) of the capacitor 48 is input to each row of the processor array via the source follower circuit 49.

Figure 13:
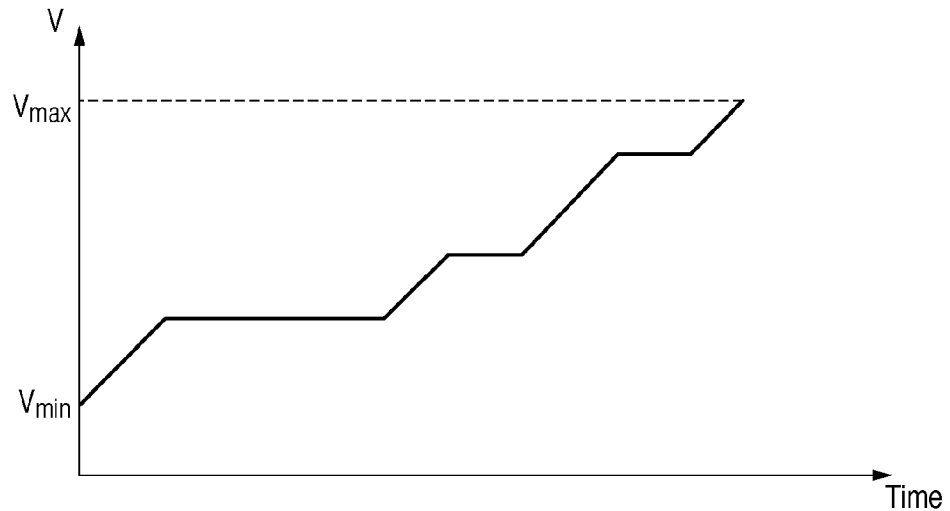
FIG. 13 is a diagram showing a variation example of a ramp voltage.

In a similar manner to in the first embodiment, the stop signal actually switches between a High signal and a Low signal in accordance to a comparison processing result (flag signal) at each PE 1. Therefore, when the stop signal is a Low signal, since a Low signal is input as a control signal to the current source 47 and the flow of current into the capacitor 48 is stopped, the ramp voltage consequently indicates a constant value with time. Therefore, the ramp voltage takes, for example, a waveform having a time variation such as shown in FIG. 13. FIG. 13 is a diagram showing a variation example of a ramp voltage.

A charge quantity $\Delta Q$ that flows into the capacitor 48 and which is accumulated within a single clock cycle is set as expressed by Formula (5):

$$\Delta Q = C(V_{max} - V_{min})/(2^6 - 1) \quad (5)$$

In the formula, reference character C represents a capacity value of a capacitor 48 and $V_{max}$ represents a maximum voltage value of the ramp voltage.

Therefore, the terminal voltage value of the capacitor 48 takes a maximum voltage value $V_{max}$ at the point where the total duration of the High signal input as a control signal to the current source 47 (the total duration in which the voltage is High) becomes $2^6 - 1 = 63$ clock cycles. In other words, a ramp voltage value indicated per each clock cycle corresponds to a voltage value obtained by converting a voltage value of the capacitor 12 corresponding to a processing result of the PE 1 at the 6-bit resolution.

The ramp voltage waveform shown in FIG. 13 is merely an example, and various waveform shapes may be taken in accordance with a comparison processing result at each PE 1. While the reference analog value input circuit 6 according to the present embodiment is configured as described above, other circuit configurations may be adopted as long as similar functions are included.

(Counter Circuit)

Next, the counter circuit 5 will be described. As shown in FIG. 1, the counter circuit 5 is configured in each row of the array processor, and as described above, commences a count operation in synchronization with the input of the ramp voltage.

The counter circuit 5 according to the present embodiment is constituted by a logic circuit, and includes a general function in which, upon commencing an operation, count-up is sequentially performed from a minimum value in increments of 1 and the counted-up values are output as bit data. In the present embodiment, the aforementioned clock signal with respect to the operation control circuit 51 that controls the ramp voltage is the same as a clock signal that executes the count-up by the counter circuit 5. The counter circuit 5 sequentially executes count-up from 0, corresponding to the minimum voltage value $V_{min}$ of the ramp voltage, to 63, corresponding to the maximum voltage value $V_{max}$ thereof.

In addition, operations of the counter circuit 5 is synchronized with operations of the aforementioned reference analog value input circuit 6. In other words, the count-up operation is executed when the control signal input to the current source 47 of the reference analog value input circuit 6 is a High signal, and the count-up operation is suspended when the input signal is a Low signal.

As shown, the operation of the reference analog value input circuit 6 that generates the ramp voltage and the operation of the counter circuit 5 are synchronized per each row of the array processor. Therefore, using an output value of the counter, it is now possible to reference a value obtained by converting a voltage value of the ramp voltage to a digital value at a 6-bit resolution.

While the counter circuit 5 according to the present embodiment is configured as described above, other circuit configurations may be adopted as long as similar functions are included.

(Comparison Circuit)

Figure 14:
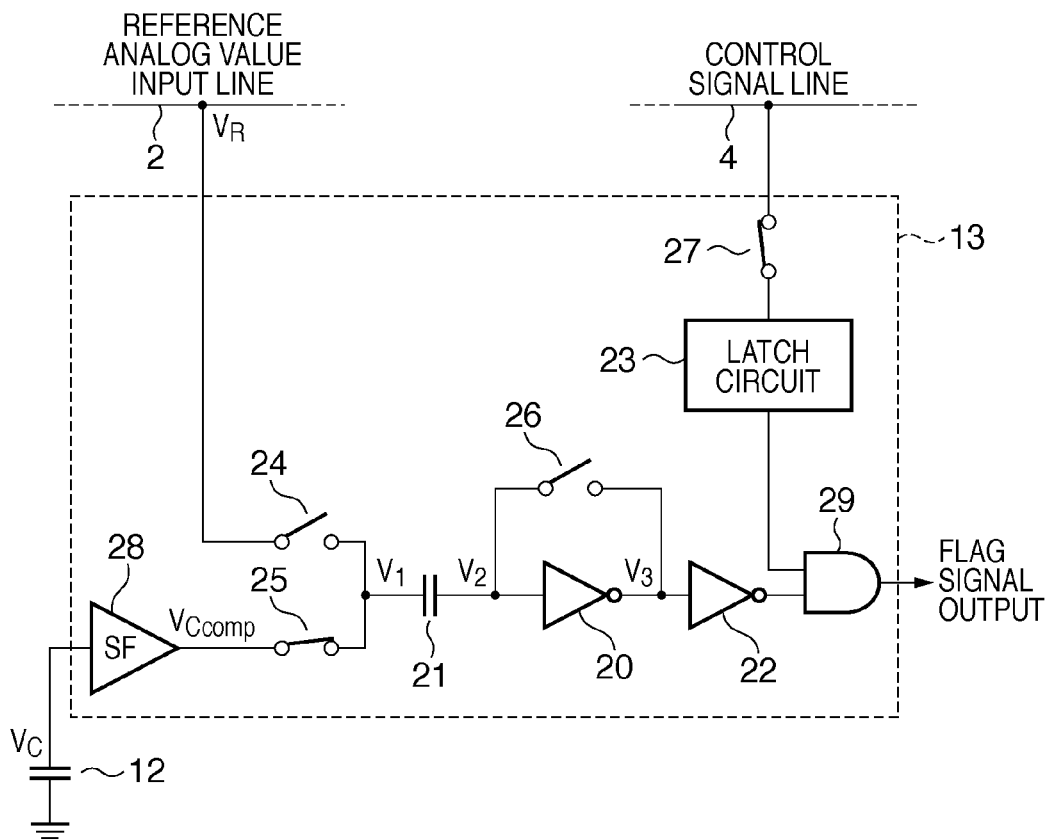
FIG. 14 is a diagram showing a configuration example of a comparison circuit.

Next, the comparison circuit 13 will be described. FIG. 14 is a diagram showing a configuration example of the comparison circuit 13 according to the present embodiment. As shown in FIG. 14, the comparison circuit 13 according to the present embodiment is configured such that an inverter 22 is further inserted to a stage subsequent to the inverter 20 in the comparison circuit 13 described in the first embodiment (FIG. 5).

In the comparison circuit 13 according to the present embodiment, when $V_R < V_{Ccomp}$, the output of the inverter 22 becomes a Low signal. In addition, when $V_R \geq V_{Ccomp}$, the output of the inverter 22 becomes a High signal. As shown, in the comparison processing performed by the comparison circuit 13, the magnitude relationship between $V_R$ and $V_{Ccomp}$ with respect to the flag signal has been inverted.

Therefore, by setting the aforementioned monotonically-increasing ramp voltage as the reference analog value, a flag signal that is a High signal can be arranged to be produced from a PE 1 whose capacitor 12 has a smaller voltage value.

As described above, operations similar to those of the configuration of the first embodiment can be performed even when the reference analog value is monotonically increased with time.

The reference analog value input circuit 6 described above is configured for each row of the array processor, and in a similar manner to the first embodiment, a ramp voltage is generated by the respective reference analog value input circuits 6 and input to the respective rows of the array processor. In addition, in a similar manner to the first embodiment, the counter circuit 5 is configured for each row of the array processor, and operates in synchronization with the respective reference analog value input circuits 6 to output a count value.

Furthermore, the comparison circuit 13 is similar to that of the first embodiment with the exception of operations attributable to the insertion of the aforementioned inverter 22. Circuit configurations other than those of the aforementioned reference analog value input circuit 6, the counter circuit 5 and the comparison circuit 13, as well as circuit operations, are similar to those of the first embodiment. Consequently, as described above, the row asynchronous output circuit according to the present embodiment enables high-speed output of processing results of an array processor.

Fourth Embodiment

A fourth embodiment of the present invention will now be described with reference to the drawings. While a row asynchronous output circuit configuration according to the present embodiment is similar to the row asynchronous output circuit configuration according to the first embodiment, operations of the reference analog value input circuit 6 and the counter circuit 5 differ. Therefore, for the present embodiment, descriptions will only be given on the reference analog value input circuit 6 and the counter circuit 5 whose operations differ from those of the first embodiment, and descriptions on other portions shall be omitted.

Figure 15:
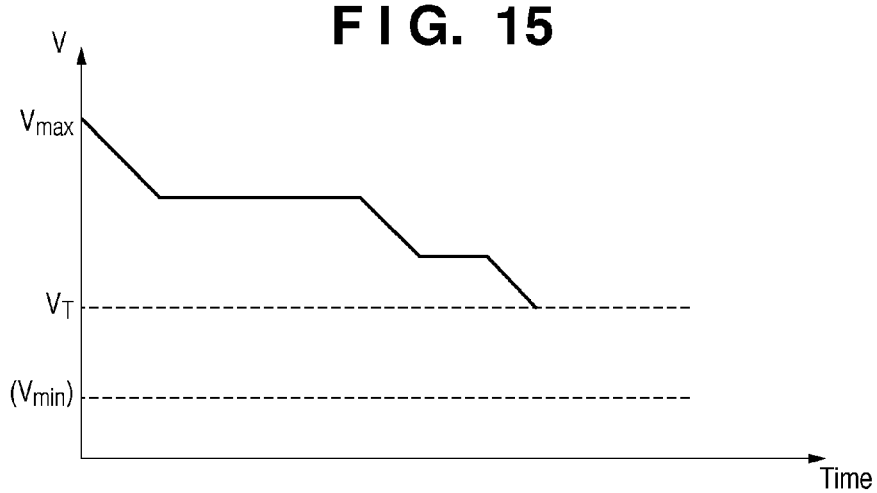
FIG. 15 is a diagram showing a variation example of a ramp voltage.

In the present embodiment, in the case where a preset ramp voltage value or a preset counter value is reached in the reference analog value input circuit 6 and the counter circuit 5, operations of the reference analog value input circuit 6 and the counter circuit 5 are terminated and, at the same time, comparison processing is also terminated. In other words, in the reference analog value input circuit 6 configured in a similar manner to the first embodiment and in which ΔQ is similarly set, processing is terminated at the point where the ramp voltage value reaches a preset value $V_T$ as shown in FIG. 15. FIG. 15 is a diagram showing a variation example of a ramp voltage. In addition, at this point, operations of the counter circuit 5 which operates in synchronization with the reference analog value input circuit 6 is also terminated.

A value Count that is output by the counter circuit 5 upon termination of operation is expressed by Formula (6) below:

$$\text{Count} = 63 - C(V_{max} - V_T)/\Delta Q \quad (6)$$

When the reference analog value input circuit 6 and the counter circuit 5 are operated as described above, column address output is not performed for PEs 1 for which $V_{Ccomp}$ in regards to the processing result retained in the capacitor 12 included therein falls below $V_T$. This means that a digital value converted from the processing result of a PE 1 which is less than the Count value is not output. In other words, this is equivalent to executing threshold value processing in which only values equal to or exceeding a preset threshold value are output.

In addition, similar processing may also be executed in the circuit configuration according to the third embodiment. In other words, let us assume that processing is terminated at a point where the ramp voltage value reaches a preset value $V_T$ and operations of the counter circuit 5 that operates in synchronization with the reference analog value input circuit 6 are also terminated. In this case, in regards to processing results retained as voltage values in the capacitors 12 included in the PEs 1, column address output is not performed for PEs 1 for which $V_{Ccomp}$ is greater than $V_T$. This means that a digital value converted from the processing result of a PE 1 which is greater than the Count value is not output, and is equivalent to executing threshold value processing in which only values equal to or less than a preset threshold value are output.

In other words, essentially, by outputting a counter value in the case where analog information stored in the capacitor 12 becomes consistent with the reference analog value, digital conversion can be performed on analog information in an appropriate manner.

As described above, the row asynchronous output circuit according to the present embodiment enables high-speed output of processing results of an array processor and also allows execution of threshold value processing on the processing results.

Fifth Embodiment

Next, a fifth embodiment of the present invention will now be described with reference to the drawings. A row asynchronous output circuit configuration according to the present embodiment differs from the first embodiment in the circuit configurations of the output signal line 3 and the control signal line 4. Therefore, for the present embodiment, descriptions will only be given on the output signal line 3 and the control signal line 4 which differ from the row asynchronous output circuit configuration described in the first embodiment, and descriptions on other portions shall be omitted.

Figure 16:
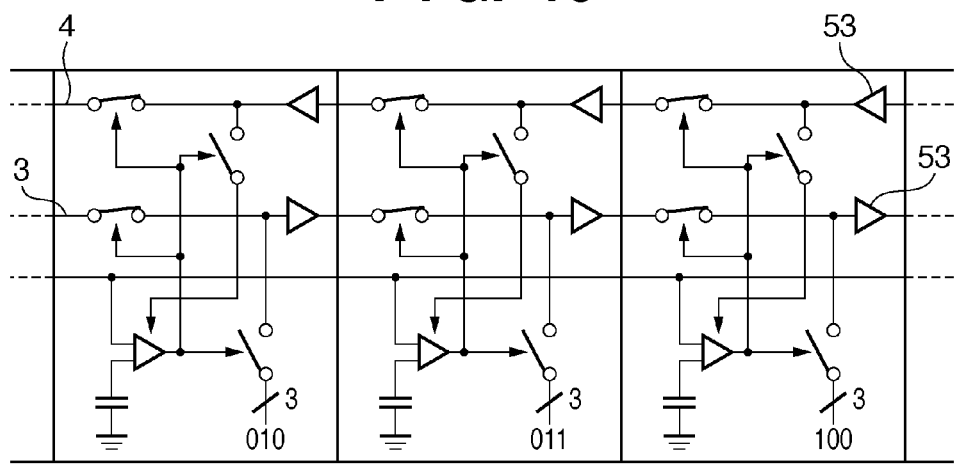
FIG. 16 is a diagram showing a configuration example of output signal lines and control signal lines.

FIG. 16 is a diagram showing a configuration example of the output signal line 3 and the control signal line 4 according to the present embodiment. As shown in FIG. 16, the output signal line 3 and the control signal line 4 include a buffer circuit 53 at the connections between the PEs 1 of the respective rows.

Figure 17:
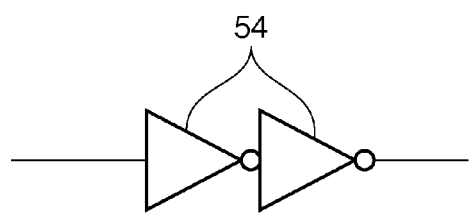
FIG. 17 is a diagram showing a configuration example of a buffer circuit.

The buffer circuit 53 according to the present embodiment is constituted by inverters 54 connected in two stages as shown in FIG. 17. FIG. 17 is a diagram showing a configuration example of the buffer circuit 53. In addition, since the output signal line 3 according to the present embodiment has a bit width of 3 bits, the buffer circuit 53 is actually applied to wirings per each bit.

In the case where the wirings of the output signal line 3 and the control signal line 4 grow in length and ON resistance components of the switches 8 to 11 inserted per each PE 1 increase, an increase in the delay time of signal transmission may occur. In contrast thereto, since the buffer circuit 53 has been inserted in the present embodiment, an increase in the delay time can be prevented.

The buffer circuit 53 need not be applied to all connections between the respective PEs 1, and need only be inserted at the connections between PEs 1 as required. In addition, a configuration of the buffer circuit 53 may be determined independently for respective output signal lines 3 and the control signal lines 4. Furthermore, as long as similar functions are included, configurations other than that described above may be used for the buffer circuit 53.

As described above, with the row asynchronous output circuit according to the present embodiment, high-speed output of processing results of an array processor can be achieved while suppressing delay time in signal transmission.

Sixth Embodiment

Next, a sixth embodiment of the present invention will now be described with reference to the drawings. A row asynchronous output circuit configuration according to the present embodiment differs from the configuration according to the first embodiment in that, in the array processor, a multiplexer 55 is used instead of the TG as the switch to be connected to the output signal line 3. Therefore, for the present embodiment, descriptions will only be given on the switch to be connected to the output signal line 3 which differs from the row asynchronous output circuit configuration according to the first embodiment, and descriptions on other portions shall be omitted.

(Processor Element)

FIG. 18 is a schematic diagram showing a detailed circuit configuration example of a single processor element (PE) 1 according to the present embodiment. As shown in FIG. 18, the switch to be connected to the output signal line 3 according to the present embodiment is constituted by the multiplexer 55. In addition, since the output signal line 3 according to the present embodiment has a bit width of 3 bits, the multiplexer 55 is actually applied to wirings per each bit.

FIG. 19 is a diagram showing a circuit configuration example of the multiplexer 55. As shown in FIG. 19, the multiplexer 55 includes three NAND circuits 56 and one inverter 57, and has a function for selecting a single signal from two inputs in accordance with a flag signal input as a control signal.

In the first embodiment, a single output signal line 3 is switched to connection states exemplified in FIGS. 8A, 8B, 8C, 8D, 8E, 8F, 8G, 8H, and 8I by respectively using two TGs to cause a flag signal to operate in reverse phase as a control signal. On the other hand, in the present embodiment, a similar function can be realized by operating a flag signal as a control signal using the multiplexer 55.

For example, when the flag signal becomes High at a given PE 1, the multiplexer 55 terminates connection of the output signal line 3 to the PE 1 adjacent on the left, and selects a connection to address data within its own PE 1. Therefore, in a similar manner to the first embodiment, address data of the PE 1 can be appropriately output.

While the connection of the output signal line 3 is constituted by TGs in the first embodiment and by the multiplexer 55 in the present embodiment, other circuit configurations may be used as long as similar wiring connection switching can be realized. For example, although a detailed description will not be given in the present embodiment, similar functions can be achieved by configuring the output signal line 3 as a tristate bus.

Moreover, although a detailed description will not be given in the present embodiment, a switch can also be configured using a circuit other than a TG in the control signal line 4 in a similar manner to the output signal line 3 described above. In other words, circuit configurations other than that described above may be adopted as long as an arbitration function is realized with respect to input/output of data to/from the output signal line 3 and the control signal line 4.

As described above, the row asynchronous output circuit according to the present embodiment enables high-speed output of processing results of an array processor.

Seventh Embodiment

Next, a seventh embodiment of the present invention will now be described with reference to the drawings. The configuration according to the present embodiment includes an encoder circuit that encodes information for identifying a PE 1 into address data. Since a row asynchronous output circuit configuration according to the present embodiment includes configurations and processing procedures which are the same as those of the row asynchronous output circuit configuration according to the first embodiment, descriptions on like portions shall be omitted hereinafter.

(Row Asynchronous Output Circuit)

Figure 20:
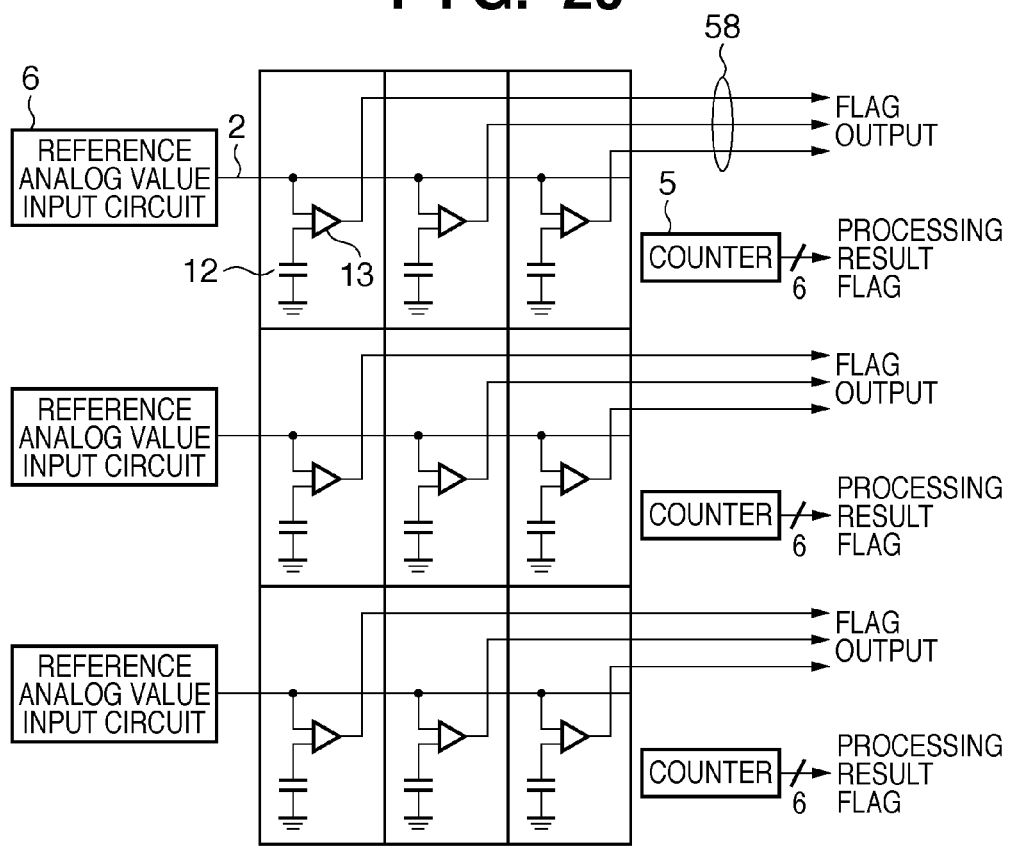
FIG. 20 is a diagram showing a configuration example of a row asynchronous output circuit in an array processor.

FIG. 20 is a diagram showing a configuration example of a row asynchronous output circuit in an array processor according to the present embodiment. As shown in FIG. 20, the row asynchronous output circuit configuration according to the present invention includes a configuration as an array processor in which processor elements (hereinafter PEs 1) are mutually connected. While the array processor may take any m-row, n-column configuration (where m, n are integers equal to or greater than 1), a case of 3 rows, 3 columns is exemplified in FIG. 20.

In addition, as shown in FIG. 20, the array processor is provided with the reference analog value input line 2 in each row. Each PE 1 respectively and independently includes an output signal line 58 for outputting a flag signal of the PE 1. In addition, as shown in FIG. 20, a counter circuit 5 is arranged in each row at an output terminal side (the right-hand side of the array processor) of an output signal line 58 of the array processor. Furthermore, a reference analog value input circuit 6 is arranged at an input terminal (the left-hand side of the array processor) of the reference analog value input line 2 of the array processor.

(Processor Element)

Figure 21:
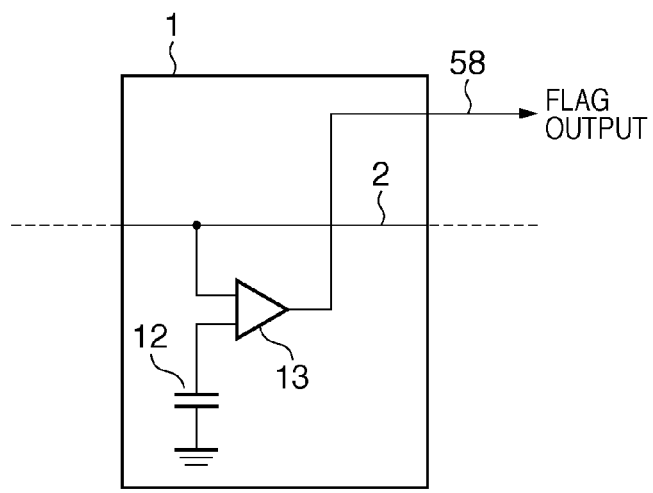
FIG. 21 is a schematic diagram showing a detailed circuit configuration example of a processor element.

FIG. 21 is a schematic diagram showing a detailed circuit configuration example of a single processor element (PE) 1. As shown in FIG. 21, the PE 1 according to the present embodiment is constituted by the capacitor 12 and the comparison circuit 13.

First, in the present embodiment, the result of processing by PEs 1 is retained as a charge quantity or a voltage value in the capacitor 12 included in each PE 1 in a similar manner to the first embodiment. In addition, the fact that, regardless of processing contents, processing results include all results that are referenced as a charge quantity or a voltage value accumulated in the capacitor 12 is also similar to the first embodiment. Furthermore, in a similar manner as the first embodiment, a charge quantity or a voltage value of the capacitor 12 that is a processing result of the PE 1 is read as 6-bit digital data.

Since the reference analog value input circuit 6 and the counter circuit 5 are similar to those of the first embodiment, descriptions thereof shall be omitted. Moreover, since operations of the comparison circuit 13 in the PE 1 are also similar to those of the first embodiment, descriptions thereof shall also be omitted.

(Operations of the Array Processor)

Figure 22:
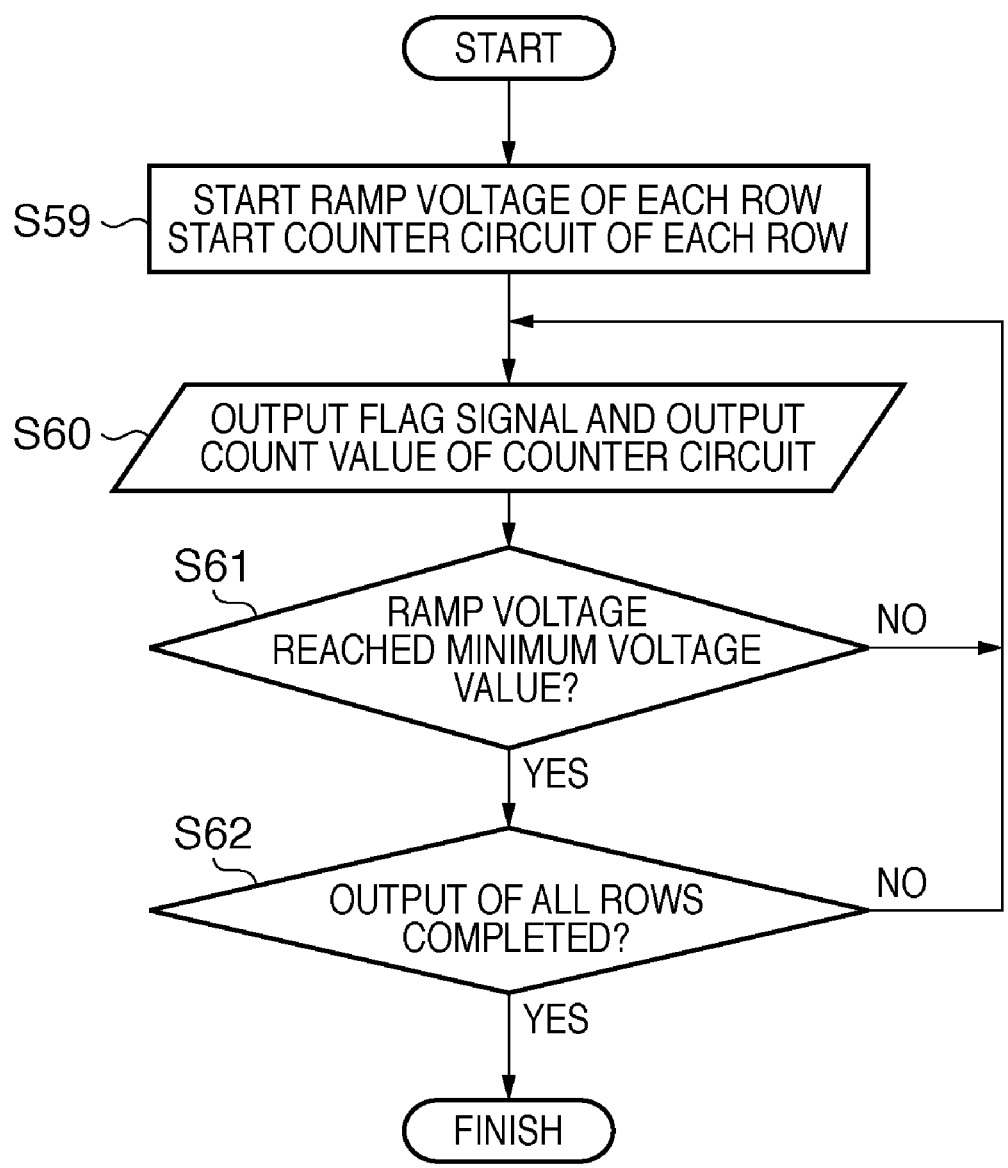
FIG. 22 is a flowchart showing a flow of operations of an array processor.

Next, a description will be given on operations of the entire array processor with reference to FIG. 22. FIG. 22 is a flowchart showing a flow of operations of the array processor according to the present embodiment.

As shown in FIG. 20, each row of the array processor includes the reference analog value input circuit 6 to which a reference analog signal is input. Similarly, each row of the array processor includes the counter circuit 5. In addition, each PE 1 includes the output signal line 58 for outputting a flag signal indicating a comparison result.

The array processor configured as described above first inputs a ramp voltage from the reference analog value input circuit to each row of the array processor (step S59 in FIG. 22).

In a similar manner as described in the first embodiment, the ramp voltage according to the present embodiment has a voltage waveform that monotonically decreases with time. The ramp voltage is commonly input to the PE 1 of each row via the reference analog value input line 2, and within each PE 1, becomes a reference voltage with respect to the comparison circuit 13.

In this case, in the course of the ramp voltage monotonically decreasing with time, the comparison circuit 13 of the PE 1 in which the voltage value of the capacitor 12 thereof had become consistent with the voltage value of the ramp voltage outputs a High signal. The High signal becomes a flag signal indicating consistency of the ramp voltage value and the voltage value of the capacitor 12 (step S60).

In actuality, as described earlier, a difference corresponding to a level shift by the source follower circuit 28 exists between the voltage value of the capacitor 12 and the voltage value of the ramp voltage in the PE 1. However, since the processing is essentially intended to compare the voltage value of the capacitor 12 with a reference voltage, in this case, the voltage difference corresponding to the level shift will not be considered and a description will be given on the assumption that both voltage values are consistent.

The flag signal is output from the output signal line 58 configured for each PE 1 (step S60). At this point, a value of the counter circuit 5 during rising of the flag signal is referenced as a digital value of the processing result of the PE 1 which had output the flag signal (step S60).

In addition, since the output signal line 58 is individually configured for all PEs 1, each flag signal is to represent positional information of a corresponding PE 1. In other words, by associating and outputting the positional information of each PE 1 and the value of the counter circuit 5, it is now possible to output a processing result of each PE 1 constituting the array processor.

Figure 23:
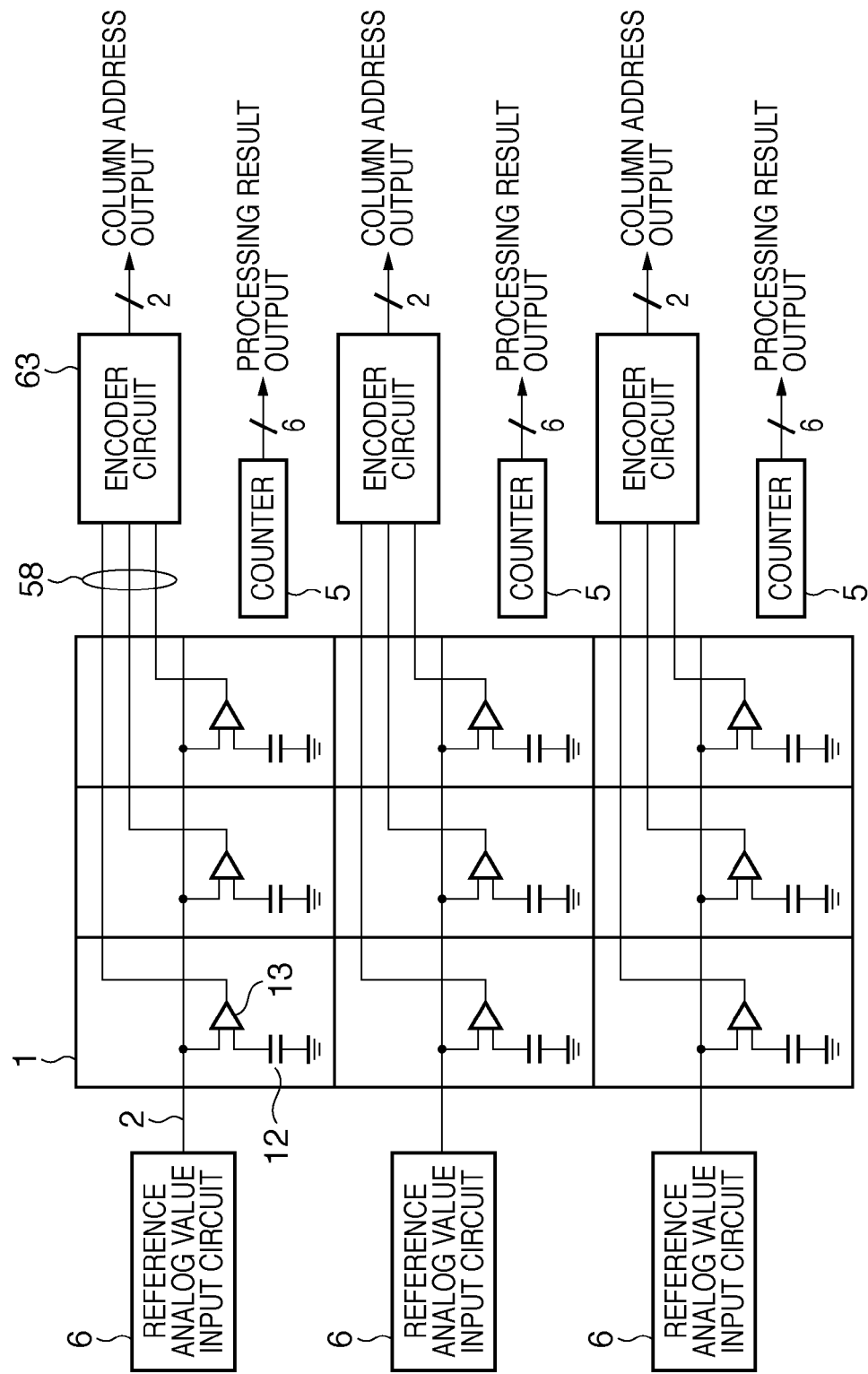
FIG. 23 is a diagram showing a configuration example of a row asynchronous output circuit provided with an encoder circuit.

Moreover, as shown in FIG. 23, each output flag signal can be converted by an encoder circuit 63 configured for each row of the array processor into a column address value of the corresponding PE 1. FIG. 23 is a diagram showing a configuration example of a row asynchronous output circuit provided with the encoder circuit 63.

FIG. 24A is a diagram showing a configuration example of a 3-input, 2-bit output encoder circuit 63, and FIG. 24B is a diagram showing a truth table of an encoder circuit. As shown in FIG. 24A, the encoder circuit 63 includes a NOR circuit 64, an OR circuit 65 and an inverter 66, and encodes inputs of flag signals 1 to 3. In addition, as shown in the truth table in FIG. 24B, the encoder circuit 63 includes a function for outputting a 2-bit column address value. In the present embodiment, 2-bit values from 01 to 11 are used as column addresses of the PE 1.

In the case where an encoder circuit is used, when flag signals become High signals at a plurality of PEs 1 at a given clock timing, encoding of each flag signal can be set to be executed in sequence, one at a time. Since the processing above is essentially the same processing as the output arbitration method described in the first embodiment, a detailed description thereof shall be omitted.

While the encoder circuit 63 is depicted in FIG. 23 as being arranged outside of the array processor, the encoder circuit 63 may be configured so as to be incorporated into the array processor. In addition, instead of using the encoder circuit, the flag signal itself may be used as an addressing signal of an external memory circuit. Furthermore, the value of the counter circuit 5 during rising of the flag signal may be associated with the flag signal of a corresponding PE 1 or an encoded address value to be stored in a memory circuit or the like.

The processing result of the PE 1 and positional information output from the array processor as described above can be appropriately used as required in order to realize predetermined processing.

Next, as the ramp voltage decreases, in a similar manner as described earlier, a flag signal rises in the PE 1 having a capacitor 12 indicating the same voltage value as the ramp voltage and the aforementioned output processing is executed. By performing the processing described above until the ramp voltage indicates the minimum voltage value, output processing of processing results of all PEs 1 is completed (steps S61 and S62 in FIG. 22).

As described above, the row asynchronous output circuit according to the present embodiment enables high-speed output of processing results of an array processor.

Since an information processing apparatus including the row asynchronous output circuit described above is capable of performing analog/digital conversion at high speed, the information processing apparatus can operate at high speed. Such an information processing apparatus can be implemented in devices such as a digital camera, a digital video camera, a mobile telephone, a personal computer, a work station, and a PDA.

As shown, the row asynchronous output circuit configuration according to the embodiments described above asynchronously outputs a comparison result of the analog value corresponding to a processing result and the reference analog value for each row of the array processor. As a result, analog/digital processing can be executed at high speed.

As described above, according to the present invention, a technique for outputting a plurality of pieces of analog information as digital information at high speed can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-226705, filed Aug. 31, 2007, which is hereby incorporated by reference herein in its entirety.

The invention claimed is:

1. An information processing apparatus, comprising:
a plurality of processor units, arranged in a matrix pattern, respectively including a storage unit adapted to store analog information and a comparison unit adapted to compare analog information stored in the storage unit with an inputted reference analog value;
an input unit adapted to input the reference analog value to the plurality of processor units while changing the reference analog value in synchronization with a clock signal;
a counter unit adapted to update a count value in synchronization with the clock signal and outputting the count value when the analog information and the reference analog value become consistent at a corresponding comparison unit;
an output unit which includes a bus-type wiring to be shared by the processor units belonging to the same row of the matrix and adapted to output identification information for identifying the processor unit at which the analog information and the reference analog value have become consistent; and
an arbitration unit adapted to arbitrate the use of the bus-type wiring by the plurality of processor units so that the plurality of processor units belonging to the same row of the matrix at which the analog information and the reference analog value have become consistent use the bus-type wiring in sequence and output identification information of the processor units,
wherein the arbitration unit includes, for each processor unit:
a terminating unit adapted to terminate the connection of the bus-type wiring to a processor unit of a subsequent stage when the analog information and the reference analog value become consistent; and
a reestablishing unit adapted to reestablish the terminated connection after outputting identification information of its own processor unit.

2. The information processing apparatus according to claim 1, wherein the plurality of processor units are grouped into a plurality of groups and the input unit and the counter unit are provided for each group.

3. The information processing apparatus according to claim 2, wherein the clock signal is independently supplied to each group.

4. The information processing apparatus according to claim 2, wherein
the plurality of processor units are arranged in a matrix pattern and
the processor units belonging to the same row of the matrix are grouped into the same group among the plurality of groups.

5. The information processing apparatus according to claim 1, wherein
the output unit includes an encoding unit adapted to encode an output from the comparison unit in the processor unit and which indicates that the analog information and the reference analog value have become consistent into the identification information for identifying the processor unit.

6. The information processing apparatus according to claim 1, wherein
the input unit generates the analog value that monotonically increases or decreases with time.

7. The information processing apparatus according to claim 6, wherein
the input unit generates the analog value that monotonically increases or decreases until reaching a threshold value, thereby the counter unit outputs a count value that is equal to or greater than the threshold value or equal to or less than the threshold value.

8. The information processing apparatus according to claim 1, wherein
the storage unit is a capacitor, and
the comparison unit is a voltage comparator.

9. The information processing apparatus according to claim 1, further comprising
a processor adapted to process digital information outputted by the counter unit.

10. An information processing apparatus, comprising:
a plurality of processor units, arranged in a matrix pattern, respectively including a storage unit adapted to store analog information and a comparison unit adapted to compare analog information stored in the storage unit with an inputted reference analog value;
an input unit adapted to input the reference analog value to the plurality of processor units while changing the reference analog value in synchronization with a clock signal;
a counter unit adapted to update a count value in synchronization with the clock signal and outputting the count value when the analog information and the reference analog value become consistent at a corresponding comparison unit;
an output unit which includes a bus-type wiring to be shared by the processor units belonging to the same row of the matrix and adapted to output identification information for identifying the processor unit at which the analog information and the reference analog value have become consistent;
an arbitration unit adapted to arbitrate the use of the bus-type wiring by the plurality of processor units so that the plurality of processor units belonging to the same row of the matrix at which the analog information and the reference analog value have become consistent use the bus-type wiring in sequence and output identification information of the processor units; and
a suspending unit adapted to suspend update of the reference analog value and the count value of the counter unit during output of identification information of the plurality of processor units belonging to the same row of the matrix and at which the analog information and the reference analog value are consistent through the sequential use of the bus-type wiring by the processor units.

* * * * *